United States Patent
Katami et al.

(10) Patent No.: US 10,023,766 B2
(45) Date of Patent: Jul. 17, 2018

(54) ELECTROCONDUCTIVE FILM LAMINATE COMPRISING TRANSPARENT PRESSURE-SENSITIVE ADHESIVE LAYER

(71) Applicant: NITTO DENKO CORPORATION, Ibaraki-shi, Osaka (JP)

(72) Inventors: Hirofumi Katami, Ibaraki (JP); Toru Umemoto, Ibaraki (JP); Hiroyuki Takao, Ibaraki (JP); Atsushi Yasui, Ibaraki (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 0 days.

(21) Appl. No.: 15/545,124

(22) PCT Filed: Jul. 11, 2016

(86) PCT No.: PCT/JP2016/070435
§ 371 (c)(1),
(2) Date: Jul. 20, 2017

(87) PCT Pub. No.: WO2017/014088
PCT Pub. Date: Jan. 26, 2017

(65) Prior Publication Data
US 2018/0022962 A1  Jan. 25, 2018

(30) Foreign Application Priority Data
Jul. 22, 2015 (JP) .................. 2015-145220

(51) Int. Cl.
*B32B 7/12* (2006.01)
*C09J 7/02* (2006.01)
(Continued)

(52) U.S. Cl.
CPC ............... *C09J 7/0207* (2013.01); *B05D 1/28* (2013.01); *B32B 7/12* (2013.01); *C09J 201/00* (2013.01);
(Continued)

(58) Field of Classification Search
CPC ......... C09J 7/38; C09J 2201/606; B32B 7/12; B32B 2457/202; B32B 2457/208
See application file for complete search history.

(56) References Cited

U.S. PATENT DOCUMENTS 6,842,288 B1   1/2005  Liu et al.
7,330,612 B2   2/2008  Nakashiba et al.
(Continued)

FOREIGN PATENT DOCUMENTS

CN   1875296 A      12/2006
CN   104290407 A    1/2015
(Continued)

OTHER PUBLICATIONS

International Search Report dated Sep. 13, 2016 for PCT/JP2016/070435.
(Continued)

*Primary Examiner* — Elizabeth E Mulvaney
(74) *Attorney, Agent, or Firm* — Hauptman Ham, LLP

(57) ABSTRACT

As one sensor layer structure for a capacitive touch panel, a layer structure in which a transparent electroconductive layer is formed on each of opposite surfaces of a single film substrate, so-called GFD structure, is used. In the structure, for sufficiently suppressing internal reflection from the transparent electroconductive layer, it is necessary to employ a technique of forming one or more refractive index adjustment (IM) layers on each of the opposite surfaces of the single film substrate. This causes a problem that production yield is likely to deteriorate, and a production cost is
(Continued)

increased. The present invention is directed to solving such a problem and, specifically, to laminating a refractive index adjustment zone-formed pressure-sensitive adhesive layer capable of being produced easily and at low cost, to each transparent electroconductive layer of a double-sided transparent electroconductive film, so as to effectively suppress internal reflection in the resulting laminate.

18 Claims, 15 Drawing Sheets

(51) Int. Cl.
    *B05D 1/28*     (2006.01)
    *C09J 201/00*     (2006.01)
    *C23C 14/08*     (2006.01)

(52) U.S. Cl.
    CPC ....... *C09J 2201/606* (2013.01); *C23C 14/086* (2013.01)

(56) References Cited

U.S. PATENT DOCUMENTS

| | | |
|---|---|---|
| 9,477,354 B2 | 10/2016 | Hao et al. |
| 9,631,126 B2 | 4/2017 | Lee et al. |
| 2002/0098352 A1 | 7/2002 | Kishioka |
| 2005/0238278 A1 | 10/2005 | Nakashiba et al. |
| 2007/0189661 A1 | 8/2007 | Nakashiba et al. |
| 2008/0107881 A1 | 5/2008 | Nakashiba et al. |
| 2008/0113168 A1 | 5/2008 | Nakashiba et al. |
| 2013/0154473 A1 | 6/2013 | Kaneko et al. |
| 2014/0138131 A1 | 5/2014 | Hao et al. |
| 2014/0345917 A1 | 11/2014 | Takada et al. |
| 2016/0084991 A1 | 3/2016 | Umemoto et al. |
| 2016/0115357 A1 | 4/2016 | Katami et al. |
| 2016/0200949 A1 | 7/2016 | Lee et al. |

FOREIGN PATENT DOCUMENTS

| | | |
|---|---|---|
| JP | 2000-323075 A | 11/2000 |
| JP | 2003-131032 A | 5/2003 |
| JP | 2003-342546 A | 12/2003 |
| JP | 2005-105228 A | 4/2005 |
| JP | 2009-120726 A | 6/2009 |
| JP | 4640740 B2 | 3/2011 |
| JP | 2011-194679 A | 10/2011 |
| JP | 2013-142773 A | 7/2013 |
| JP | 2013-202844 A | 10/2013 |
| JP | 5520752 B2 | 6/2014 |
| JP | 5564748 B2 | 8/2014 |
| TW | 201400295 A | 1/2014 |
| WO | 2015/031246 A1 | 3/2015 |
| WO | 2015/108159 A1 | 7/2015 |
| WO | 2015/108160 A1 | 7/2015 |

OTHER PUBLICATIONS

Written Opinion and Search Report dated Dec. 18, 2017 issued by Singapore Patent Office in connection with the counterpart Singapore Patent Application No. 11201706974U.

Chinese Office Action dated May 11, 2018 for corresponding Chinese Application No. 201680012830.3, citing the above references with partial English Translation.

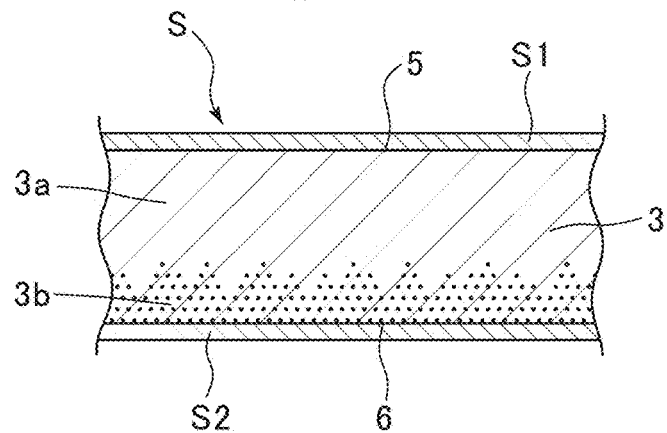
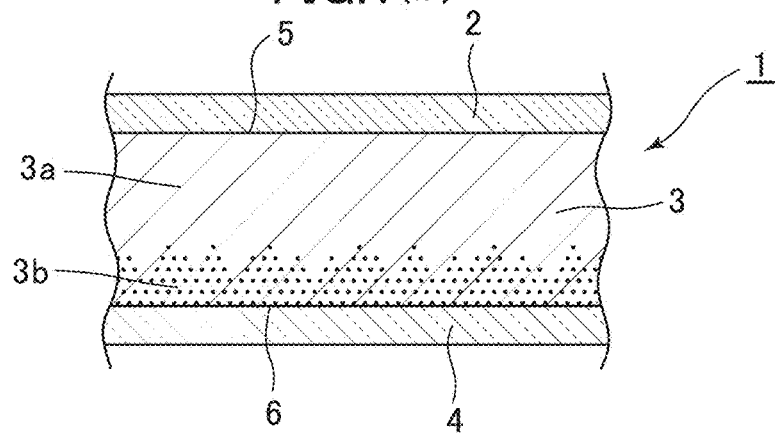
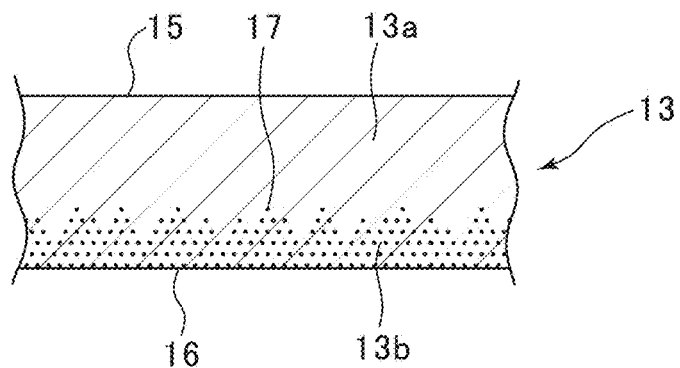

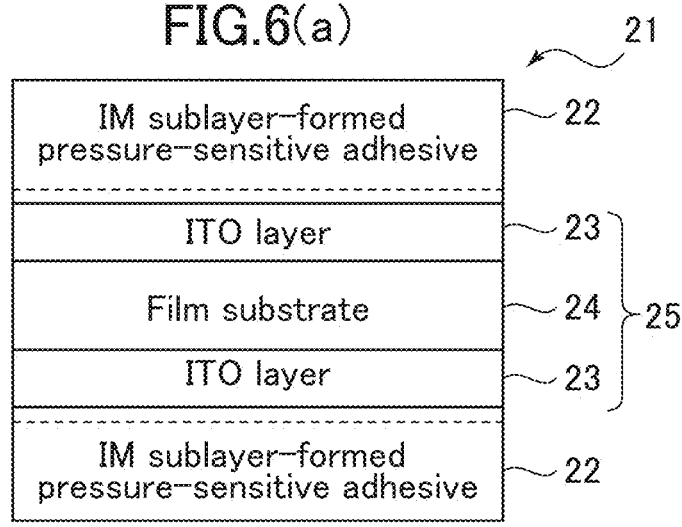
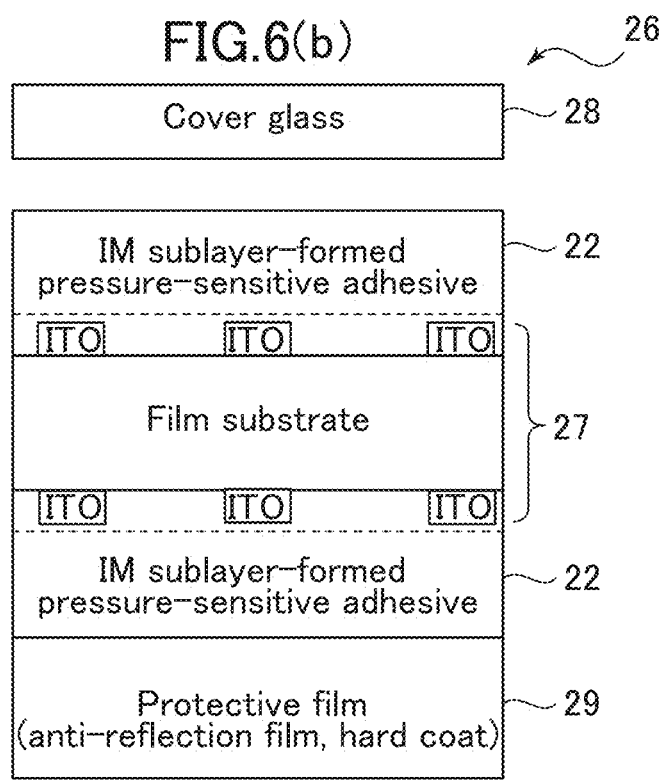

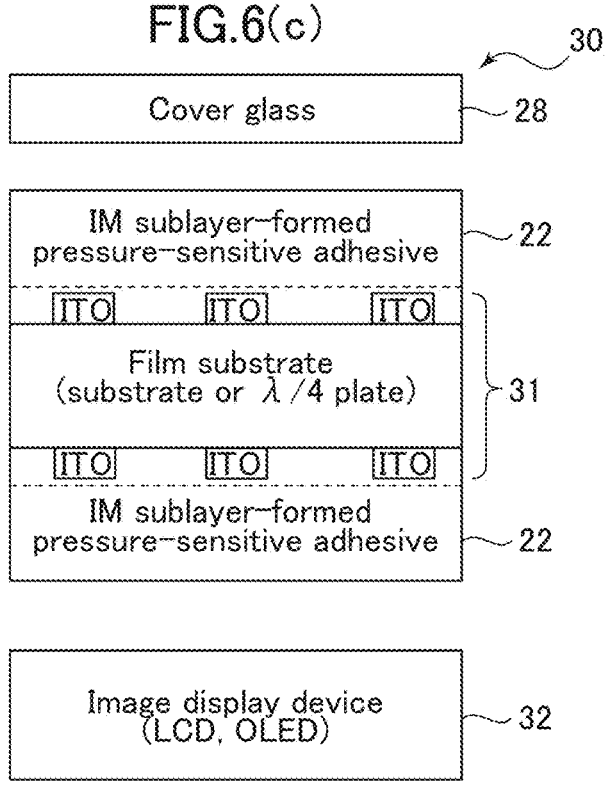
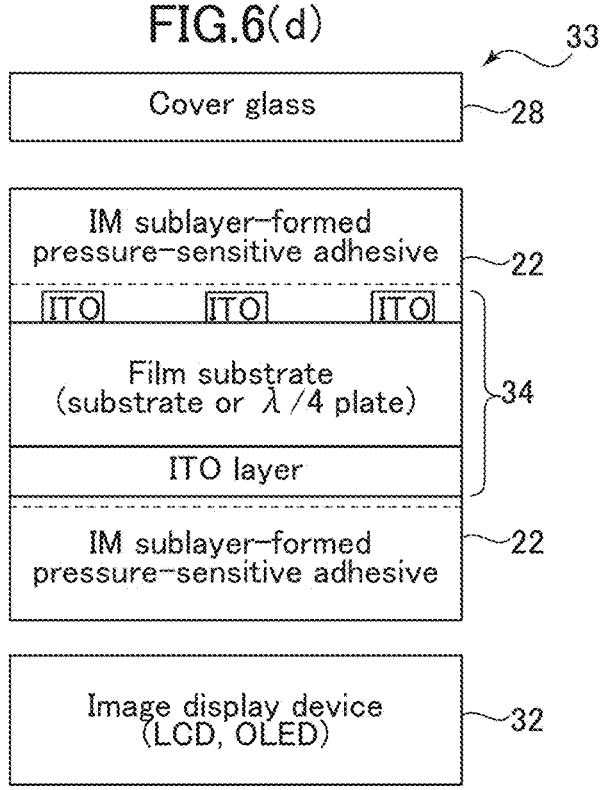

ELECTROCONDUCTIVE FILM LAMINATE COMPRISING TRANSPARENT PRESSURE-SENSITIVE ADHESIVE LAYER

CROSS REFERENCE TO RELATED APPLICATION

This application claims the priority of Japanese Patent Application No. 2015-145220, filed on Jul. 22, 2015, in the JPO (Japanese Patent Office). Further, this application is the National Phase Application of International Application No. PCT/JP2016/070435, filed on Jul. 11, 2016, which designates the United States and was published in Japan. Both of the priority documents are hereby incorporated by reference in their entireties.

TECHNICAL FIELD

The present invention relates to an electroconductive film laminate having transparent pressure-sensitive adhesive layers on opposite sides thereof. In particular, the present invention relates to an electroconductive film laminate comprising a transparent electroconductive film having transparent electroconductive layers on opposite sided thereof, wherein a pressure-sensitive adhesive sheet comprising a pressure-sensitive adhesive layer capable of effectively suppressing internal reflection in the electroconductive film laminate is laminated to each of opposite surfaces of the transparent electroconductive film.

BACKGROUND ART

In a display device such as a liquid crystal display device or an organic EL display device, a pressure-sensitive adhesive is used to bond a transparent optical element, such as a polarizing film, a retardation film or a transparent cover element including a cover glass, to another optical element. That is, a pressure-sensitive adhesive layer is disposed between two optical elements to be bonded together, and then the two optical elements are pressed against each other and bonded together to thereby form an optical element laminate. In a display device, the optical element laminate configured as above is disposed such that the transparent optical element is located on a viewing side. This configuration involves a problem that, when outside light enters from the transparent optical element on the viewing side, the entered light is reflected at an interface between the pressure-sensitive adhesive layer and the optical element on a non-viewing side, and returned to the viewing side. This problem becomes prominent particularly when an entry angle of outside light is relatively large.

On the other hand, in a touch panel-equipped display device which has been increasingly becoming popular in late years, a transparent electroconductive layer such as a patterned ITO (Indium Tin Oxide) layer is formed on a surface of a bonding-target optical element to which a transparent optical element is to be bonded. In this type of display device, the problem "poor pattern invisibility" is pointed out that a pattern of the transparent electroconductive layer becomes visible from the viewing side, by the influence of internal reflection of entered light at an interface between a pressure-sensitive adhesive layer and the transparent electroconductive layer.

In each case, the internal reflection is caused by a difference in refractive index between the pressure-sensitive adhesive layer and each of the bonding-target optical element and the transparent electroconductive layer. JP 4640740 B (Patent Document 1) teaches a technique for addressing this problem. Specifically, the Patent Document 1 discloses a pressure-sensitive adhesive composition capable of reducing total reflection of light at an interface between a transparent optical element and a pressure-sensitive adhesive layer and at an interface between the pressure-sensitive adhesive layer and a bonding-target optical element. The composition disclosed in the Patent Document 1 is allegedly described as having a high refractive index in its dried and/or cured states, wherein it is close to refractive indexes of the transparent optical element and the bonding-target optical element body. The teaching of the Patent Document 1 is that a pressure-sensitive adhesive layer for bonding two optical elements together is entirely formed to have a refractive index close to refractive indexes of the two optical elements.

The technique taught by the Patent Document 1 would be effective in suppressing the interface reflection. On the other hand, there is a problem that the composition itself becomes costly, because this technique is based on the use of a particular monomer component.

JP 5564748 B (Patent Document 2) discloses a refractive index-adjusted pressure-sensitive adhesive which comprises a transparent base pressure-sensitive adhesive material comprised of an acrylic-based resin, and zirconium oxide or titanium oxide particles having an average dispersed particle size of 1 nm to 20 nm, wherein the zirconium oxide or titanium oxide particles are dispersed over the entire thickness of the transparent base pressure-sensitive adhesive material. In this pressure-sensitive adhesive, the zirconium oxide or titanium oxide particles as a high refractive index material are mixed with the transparent base pressure-sensitive adhesive material. Thus, it is considered that a refractive index of a layer of the pressure-sensitive adhesive can be increased in its entirety to thereby suppress the aforementioned interface reflection. However, the technique disclosed in the Patent Document 2 requires using the high refractive index material in large amounts. This causes a concern about deterioration in properties required as a pressure-sensitive adhesive, and a problem of an increase in cost. Moreover, the high refractive index material used in the Patent Document 2 is particles of an inorganic material. Thus, there is another problem that the particles are hardly dispersed, causing whitish haze due to light scattering. In this regard, it is conceivable to use particles of an organic material. In this case, however, it becomes difficult to solve a problem of coloration.

With a view to improving the technique disclosed in the Patent Document 2, JP 5520752 B (Patent Document 3) proposes coating, with a polymer, metal oxide particles to be dispersed in a pressure-sensitive adhesive. The teaching of the Patent Document 3 is that, although the pressure-sensitive adhesive layer in the Patent Document 2 has a problem of deterioration in adherence property thereof because the metal oxide particles are exposed to a surface of the pressure-sensitive adhesive layer, this problem can be solved by coating the metal oxide particles with a polymer. The technique proposed by the Patent Document 3 could have a potential to improve the adherence property of the pressure-sensitive adhesive layer to some extent. However, it cannot solve most of the remaining problems pointed out in connection with the Patent Document 2. In particular, the technique described in the Patent Document 3 is based on coating the metal oxide particles with a particular polymer. Thus, the resulting pressure-sensitive adhesive becomes more costly than that in the Patent Document 2.

CITATION LIST

Patent Document

Patent Document 1: JP 4640740 B
Patent Document 2: JP 5564748 B
Patent Document 3: JP 5520752 B

SUMMARY OF INVENTION

Technical Problem

It is a primary object of the present invention to provide a pressure-sensitive adhesive sheet comprising a pressure-sensitive adhesive layer capable of being easily produced at low cost and effectively suppressing internal reflection when used for bonding of an optical element laminate (i.e., a pressure-sensitive adhesive sheet having a refractive index adjustment zone (also termed "refractive index adjustment sublayer")), to thereby solve an aftermentioned problem occurring when the pressure-sensitive adhesive sheet having the refractive index adjustment zone (also termed "refractive index adjustment zone-formed pressure-sensitive adhesive sheet") is used for a touch sensor laminate for use in a display panel device having a touch input function.

As one sensor layer structure for a capacitive touch panel, a layer structure in which transparent electroconductive layers are formed on opposite surfaces of a single film substrate, so-called GFD structure (cover glass+two-sided ITO layer-laminated film), is used. As compared to a conventional GFF (cover glass+single-sided ITO film×2) structure, the GFD structure can facilitate reduction in thickness of a laminate and reduce the number of steps of a lamination process during production of the laminate. In addition, by forming an electroconductive pattern (X, Y) on opposite sides of or on one side of the film substrate, it becomes possible to eliminate a bothersome operation such as position adjustment. Further, the number of films to be laminated is reduced. This provides an advantage of being able to reduce a thickness of a touch sensor, and improve deterioration in display quality due to film coloration.

In the GFD structure, for sufficiently suppressing internal reflection from the transparent electroconductive layer, it is necessary to employ a technique of forming multi-layered refractive index adjustment (IM) layers on the opposite surfaces of the single film substrate, or a technique of additionally forming a refractive index adjustment layer on a patterned electroconductive layer in an overcoating manner. This causes an increase in the number of steps of the lamination process, thereby leading to a problem that production yield is likely to deteriorate, and a production cost is increased.

Solution to Technical Problem

In brief, the present invention is directed to solving such a problem and, specifically, to laminating a refractive index adjustment zone-formed pressure-sensitive adhesive layer capable of being produced easily and at low cost, to each transparent electroconductive layer of a double-sided transparent electroconductive film, so as to effectively suppress internal reflection in the resulting laminate without deterioration in production yield.

Specifically, according to one aspect of the present invention, there is provided a double-sided transparent electroconductive film laminate which comprises: a transparent film substrate; a first transparent electroconductive layer on one of opposite surfaces of the transparent film substrate; a second transparent electroconductive layer on the other surface of the transparent film substrate; a transparent, first pressure-sensitive adhesive layer on a surface of the first transparent electroconductive layer on a side opposite to the transparent film substrate; and a transparent, second pressure-sensitive adhesive layer on a surface of the second transparent electroconductive layer on a side opposite to the transparent film substrate, wherein each of the first and second pressure-sensitive adhesive layers comprises: a base adhesive zone made essentially of a transparent base pressure-sensitive adhesive material and formed over a given range from one principal surface of the pressure-sensitive adhesive layer in a thickness direction of the pressure-sensitive adhesive layer; and a transparent, adherent, refractive index adjustment zone formed over a given range from the other principal surface of the pressure-sensitive adhesive layer in the thickness direction, wherein the refractive index adjustment zone is in contact with a corresponding one of the first and second transparent electroconductive layers, and has a refractive index greater than a refractive index of the base pressure-sensitive adhesive material.

Preferably, the refractive index adjustment zone has a thickness of 20 nm to 600 nm. In one embodiment of the present invention, the refractive index adjustment zone may be formed by dispersing, in a pressure-sensitive adhesive material identical to the base pressure-sensitive adhesive material, particles of a high refractive index material having a refractive index greater than that of the pressure-sensitive adhesive material, to thereby increase an average refractive index of the refractive index adjustment zone. In this embodiment, the refractive index of the high refractive index material particles is preferably in the range of 1.60 to 2.74. Preferably, the high refractive index material particles have an average primary particle size of 3 nm to 100 nm as measured by TEM observation. Preferably, the high refractive index material is one or more compounds selected from the group consisting of $TiO_2$, $ZrO_2$, $CeO_2$, $Al_2O_3$, $BaTiO_3$, $Nb_2O_5$ and $SnO_2$.

In another embodiment of the present invention, the other principal surface of the pressure-sensitive adhesive layer defined by the refractive index adjustment zone may be formed such that it has a region on which the high refractive index material particles are partially exposed, and a matrix region on which the base pressure-sensitive adhesive material of the refractive index adjustment zone is partially exposed. In this embodiment, the region on which the high refractive index material particles are exposed is preferably formed in an area ratio of 30 to 99%. Further, a difference between the refractive index of the high refractive index material particles and the refractive index of the base pressure-sensitive adhesive material is preferably in the range of 0.15 to 1.34.

In the present invention, each of the first and second pressure-sensitive adhesive layers preferably has a total light transmittance of 80% or more. The high refractive index material particles may partially exist in the form of an aggregate arising from aggregation of two or more thereof.

Preferably, the refractive index adjustment zone has a thickness of 20 nm to 600 nm. In one embodiment of the present invention, the refractive index adjustment zone may be formed by dispersing, in a pressure-sensitive adhesive material identical to the base pressure-sensitive adhesive material, particles of a high refractive index material having a refractive index greater than that of the pressure-sensitive adhesive material, to thereby increase an average refractive index of the refractive index adjustment zone. In this embodiment, preferably, the refractive index of the base pressure-sensitive adhesive material is set in the range of 1.40 to 1.55, and the refractive index of the high refractive index material particles is set in the range of 1.60 to 2.74. A bonding surface of the refractive index adjustment zone bonded to an optical element is formed such that it has a region where the high refractive index material particles are in contact with the optical element, and a matrix region where the pressure-sensitive adhesive material of the refractive index adjustment zone is in contact with the optical element. In this case, the region where the high refractive index material particles are in contact with the optical element is preferably formed in an area ratio of 30 to 99%. Further, a difference between the refractive index of the high refractive index material particles and the refractive index of the base pressure-sensitive adhesive material is preferably in the range of 0.15 to 1.34.

In still another embodiment of the present invention, the refractive index adjustment zone may be formed by adding, to a pressure-sensitive adhesive material identical to the base pressure-sensitive adhesive material, an organic material having a refractive index greater than that of the pressure-sensitive adhesive material, in the form of particle, polymer or oligomer, to thereby increase an average refractive index of the refractive index adjustment zone. In the case where the pressure-sensitive adhesive layer having this feature is applied to a configuration obtained by forming a transparent electroconductive layer on an optical element, the refractive indexes of the transparent electroconductive layer, the base pressure-sensitive adhesive material and the organic material are preferably set, respectively, in the range of 1.75 to 2.14, in the range of 1.40 to 1.55 and in the range of 1.59 to 2.04. Examples of the high refractive index organic material usable herein include, but are not particularly limited to, a resin having an aromatic ring such as a styrene-based resin, and a resin containing a heteroatom such as a sulfur atom or a nitrogen atom (e.g., a polymer containing a thiol or triazine ring). Further, examples of the particles include nanometer-size organic nanoparticles and nanometer-size spherical macromolecules. Preferably, such particles have an average primary particle size of 3 nm to 100 nm as measured by TEM observation.

Preferably, each of the first and second pressure-sensitive adhesive layers preferably has a total light transmittance of 80% or more. The high refractive index material particles may partially exist in the form of an aggregate arising from aggregation of two or more thereof. In the present invention, the refractive index adjustment zone typically exists with irregular depths in the thickness direction of the pressure-sensitive adhesive layer.

For example, when the pressure-sensitive adhesive sheet relating to the present invention is used to bond a transparent, first optical element to a second optical element having a transparent electroconductive layer constituting a touch sensor or the like, the pressure-sensitive adhesive layer is peeled off from the support, and positionally adjusted such that one surface of the pressure-sensitive adhesive layer defined by the transparent, adherent, refractive index adjustment zone faces the transparent electroconductive layer and the second optical element, and the other surface of the pressure-sensitive adhesive layer faces the first optical element. Then, the other surface of the pressure-sensitive adhesive layer is bonded to the first optical element, and the refractive index adjustment zone is brought into contact with both of the transparent electroconductive layer and the second optical element in such a manner as to fill up a stepped space between the transparent electroconductive layer and the second optical element, whereby reflected light resulting from reflection of external light entering through the first optical element, at an interface between the base adhesive zone and the refractive index adjustment zone, and reflected light resulting from reflection of the external light at an interface between the refractive index adjustment zone and the transparent electroconductive layer, are at least partially cancelled out by means of optical interference.

Thus, when the pressure-sensitive adhesive sheet relating to the present invention is used to suppress such internal reflection, it is possible to at least partially cancel out reflected light resulting from reflection of external light entering through the first optical element, at an interface between a zone made essentially of the base pressure-sensitive adhesive material and the refractive index adjustment zone in the pressure-sensitive adhesive layer, and reflected light resulting from reflection of the external light at an interface between the refractive index adjustment zone and the second optical element, by means of optical interference.

Effect of Invention

In the present invention, the refractive index adjustment zone having a refractive index greater than that of the base pressure-sensitive adhesive material is formed over a given range from the other principal surface of the pressure-sensitive adhesive layer in the thickness direction, so that it becomes possible to form a high refractive index region without causing an increase in haze value. Thus, when the pressure-sensitive adhesive sheet relating to the present invention is used to bond the aforementioned two optical elements together, the refractive index adjustment zone as a high refractive index region can adjust a refractive index difference with respect to the second optical element to thereby suppress reflection at the interface between the pressure-sensitive adhesive layer and the second optical element.

In the configuration where a patterned transparent electroconductive layer is formed on the second optical element, the refractive index of the refractive index adjustment zone of the pressure-sensitive adhesive layer can be adjusted with respect to respective refractive indexes of the transparent electroconductive layer and the second optical element, so as to suppress interface reflection. Further, reflected light returning toward the first optical element can be significantly reduced by a cancel-out effect based on an inter-reflected light phase difference among reflected light by the transparent electroconductive layer, reflected light by the second optical element and reflected light occurring inside the pressure-sensitive adhesive layer.

In the double-sided transparent electroconductive film laminate of the present invention, the refractive index adjustment zone-formed pressure-sensitive adhesive layer capable of being produced easily and at low cost is laminated to each of the first and second transparent electroconductive layers, so that it becomes possible to effectively suppress internal reflection in the laminate without deterioration in production yield. This makes it possible to provide a laminate sensor which is reduced in terms of an overall thickness thereof and improved in terms of deterioration in display quality due to film coloration, with a good production yield.

BRIEF DESCRIPTION OF DRAWINGS

FIG. 1(a) is a sectional view depicting one embodiment of a pressure-sensitive adhesive sheet relating to the present invention.

FIG. 1(b) is a sectional view depicting an optical element laminate presented as one example of a simplest embodiment using a pressure-sensitive adhesive sheet according to the present invention (a simplest example of use of a pressure-sensitive adhesive sheet in FIG. 1(a)).

FIG. 2 is a sectional view depicting one embodiment of a pressure-sensitive adhesive layer for use in the pressure-sensitive adhesive sheet relating to the present invention.

FIG. 6(a) is a sectional view depicting a double-sided ITO film laminate sensor according to one embodiment of the present invention.

FIG. 6(b) is a sectional view depicting a double-sided ITO film laminate sensor according to another embodiment of the present invention.

FIG. 6(c) is a sectional view depicting a double-sided ITO film laminate sensor according to yet another embodiment of the present invention.

FIG. 6(d) is a sectional view depicting a double-sided ITO film laminate sensor according to still another embodiment of the present invention.

DESCRIPTION OF EMBODIMENTS

Figure 3:
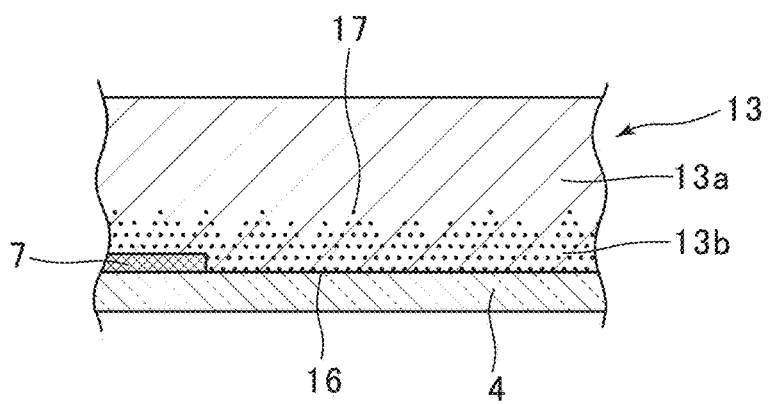
FIG. 3 is a sectional view depicting an embodiment where the pressure-sensitive adhesive layer 13 depicted in FIG. 2 is applied to a configuration in which a patterned transparent electroconductive layer is formed on an optical element.

An embodiment of the present invention will now be described in connection with the figures. FIG. 1(a) is a sectional view depicting one embodiment of a pressure-sensitive adhesive sheet relating to the present invention. FIG. 1(b) is a sectional view depicting an optical element laminate 1 presented as one example of a simplest embodiment using a pressure-sensitive adhesive sheet according to the present invention (a simplest example of use of a pressure-sensitive adhesive sheet in FIG. 1(a)). Referring to FIG. 1(a), a pressure-sensitive adhesive sheet S relating to the present invention comprises: an optically transparent pressure-sensitive adhesive layer 3; a first support S1 composed of a separator laminated to one principal surface of the pressure-sensitive adhesive layer 3; and a second support S2 composed of a separator laminated to the other principal surface of the pressure-sensitive adhesive layer 3. Referring to FIG. 1(b), the optical element laminate 1 comprises an optically transparent, first optical element 2, and a second optical element 4 bonded to the first optical element 2 through an optically transparent pressure-sensitive adhesive layer 3. This pressure-sensitive adhesive layer 3 is obtained by peeling off the supports S1, S2 from the pressure-sensitive adhesive sheet S depicted in FIG. 1(a), wherein the first and second optical elements are laminated to the exposed opposite surfaces of the pressure-sensitive adhesive layer 3. The transparent, first optical element 2 may be composed of an optical film for use in an optical display device, such as a polarizing film or a retardation film, or a transparent cover element for use in an optical display device, such as a viewing-side cover glass. The first optical element 2 and the second optical element 4 are bonded, respectively, to a first principal surface 5 and a second principal surface 6 of the pressure-sensitive adhesive layer 3.

The transparent pressure-sensitive adhesive layer 3 comprises a base adhesive zone 3a made essentially of a base pressure-sensitive adhesive material, and a refractive index adjustment zone 3b having a refractive index greater than that of the base adhesive zone 3a. Preferably, the refractive index of the base pressure-sensitive adhesive material of the base adhesive zone 3a is close to the refractive index of the first optical element 2.

The base pressure-sensitive adhesive material is not particularly limited, as long as it is a transparent adherent material usable in optical applications. For example, it is possible to use one or more appropriately selected from the group consisting of an acrylic-based pressure-sensitive adhesive, a rubber-based pressure-sensitive adhesive, a silicone-based pressure-sensitive adhesive, a polyester-based pressure-sensitive adhesive, a urethane-based pressure-sensitive adhesive, an epoxy-based pressure-sensitive adhesive, and a polyether-based pressure-sensitive adhesive. From a viewpoint of transparency, processability, durability, etc., it is preferable to use an acrylic-based pressure-sensitive adhesive. As the base pressure-sensitive adhesive material, the above pressure-sensitive adhesives may be used independently or in the form of a combination of two or more of them. An acrylic-based polymer to be used as a base polymer of an acrylic-based pressure-sensitive adhesive is preferably, but not particularly limited to, a homopolymer or copolymer of monomers comprising a primary component consisting of (meth)acrylic acid alkyl ester. It should be noted that the term "(meth)acrylic" is used herein to mean either one or both of "acrylic" and "methacrylic", and this definition is also applied to the following description. In this specification, the term "acrylic-based polymer" is used to mean that it may include the above (meth)acrylic acid alkyl ester, and any other monomer copolymerizable with the (meth)acrylic acid alkyl ester. Generally, the refractive index of the base pressure-sensitive adhesive material is in the range of 1.40 to 1.55.

Various additives may be added to the base pressure-sensitive adhesive material for use in the present invention. For example, it is preferable to add any of various silane coupling agents so as to improve adhesion under high-temperature and high-humidity conditions. This silane coupling agent also has an effect of imparting a cohesion force which acts to improve durability of a pressure-sensitive adhesive. It is also preferable to add a cross-linking agent to the pressure-sensitive adhesive layer for use in the present invention, because the cross-linking agent can impart a cohesion force associated with durability of a pressure-sensitive adhesive. Further, it is possible to use, as needed basis, viscosity modifier, release regulator, tackifier, plasticizer, softener, filler composed of an inorganic powder or the like, colorant (pigment, dye, etc.), pH adjuster (acid or base), rust inhibitor, antioxidant and ultraviolet absorber.

Although a thickness of the pressure-sensitive adhesive layer 3 is not particularly limited, it is set, typically, in the range of 5 μm to 500 μm, preferably, in the range of 5 μm to 350 μm, more preferably, in the range of 5 μm to 250 μm. In the pressure-sensitive adhesive layer 3, a thickness of the refractive index adjustment zone 3b is set, preferably, in the range of 20 nm to 600 nm, more preferably, in the range of 20 nm to 300 nm, furthermore preferably, in the range of 20 nm to 200 nm. A boundary between the refractive index adjustment zone 3b and the base adhesive zone 3a is formed as an irregular undulating curve. In the present invention, the thickness of the refractive index adjustment zone 3b is determined by averaging a plurality of measurement values of a depth of the undulation. A thickness of the base adhesive zone 3a is derived by subtracting the thickness of the refractive index adjustment zone 3b from the thickness of the pressure-sensitive adhesive layer 3. As measured according to JIS K7361, a total light transmittance of the entire pressure-sensitive adhesive layer 3 is 80% or more, preferably, 90% or more. It is preferable to achieve a higher total light transmittance of the pressure-sensitive adhesive layer 3. Further, a haze value of the pressure-sensitive adhesive layer 3 is preferably 1.5% or less, more preferably, 1% or less.

The refractive index adjustment zone 3b can be formed, for example, by applying, by a given amount, a solution of a resin material having a refractive index greater than that of the base pressure-sensitive adhesive material, onto one surface of a pressure-sensitive adhesive layer formed of the base pressure-sensitive adhesive material (this layer will hereinafter be also referred to as "base pressure-sensitive adhesive material layer"), and then subjecting the resulting pressure-sensitive adhesive layer to drying. Examples of the resin material usable for this purpose include a pressure-sensitive adhesive composition described in the Patent Document 1. Alternatively, it is possible to employ a technique of: dispersing, in the form of a solid, an organic material having a refractive index greater than that of the base pressure-sensitive adhesive material, such as styrene oligomer, in a dispersion medium to prepare a dispersion liquid; applying the dispersion liquid to a surface of a base pressure-sensitive adhesive material layer; and subjecting the resulting pressure-sensitive adhesive layer to drying. However, in the present invention, it is preferable to employ a technique of causing particles of a high refractive index material to infiltrate into the base pressure-sensitive adhesive material layer from one surface thereof, whereby the high refractive index material particles are dispersed in a region of the base pressure-sensitive adhesive material layer adjacent to the one surface, as described below in connection with FIG. 2.

With reference to FIG. 2, a configuration of a pressure-sensitive adhesive layer 13 according to one embodiment of the present invention will be described in detail below.

As with the pressure-sensitive adhesive layer 3 in the embodiment depicted in FIG. 1, the pressure-sensitive adhesive layer 13 depicted in FIG. 2 according to one embodiment of the present invention has a first principal surface 15 and a second principal surface 16, and comprises a base adhesive zone 13a made essentially of a base pressure-sensitive adhesive material, and a refractive index adjustment zone 13b having a refractive index greater than that of the base adhesive zone 13a. In this example, the refractive index adjustment zone 13b is formed such that it contains particles 17 of a high refractive index material which are caused to infiltrate into a base pressure-sensitive adhesive material layer from the second principal surface 16, and dispersed in the base pressure-sensitive adhesive material layer, over a given depth in a thickness direction of the base pressure-sensitive adhesive material layer, to thereby have a refractive index greater than that of the base adhesive zone 13a.

Preferably, a refractive index of the high refractive index material particles 17 in the refractive index adjustment zone 13b is in the range of 1.6 to 2.7. Preferably, a difference between the refractive index of the high refractive index material particles and the refractive index of the base pressure-sensitive adhesive material is in the range of 0.2 to 1.3. In the case where the refractive index adjustment zone is formed by impregnating a part of the base pressure-sensitive adhesive material layer with an organic material having a refractive index greater than that of the base pressure-sensitive adhesive material, a difference between the refractive index of the organic material and the refractive index of the base pressure-sensitive adhesive material is preferably set in the range of 0.1 to 0.6. From a viewpoint of durability under high temperature or high temperature and high humidity, it is preferable to use an inorganic high refractive index material, instead of a resin material. Examples of a high refractive index material usable in this example where high refractive index material particles are used in the refractive index adjustment zone include $TiO_2$, $ZrO_2$, $CeO_2$, $Al_2O_3$, $BaTiO_2$, $Nb_2O_5$ and $SnO_2$, and one or more compounds selected from them can be used to form the high refractive index material particles 17. The high refractive index material particles 17 may be set to have an average primary particle size of 3 nm to 100 nm, and distributed in the refractive index adjustment zone 13b in an individually dispersed state or in a partially aggregated state. As described in connection with FIG. 1, a boundary between the refractive index adjustment zone 13b and the base adhesive zone 13a is formed as an irregular undulating curve. In a thickness measurement for the refractive index adjustment zone 13b, a depth at each of a plurality of measurement positions in a region where 90% of the high refractive index material particles 17 exist is determined as a thickness measurement value, and the measurement values at the plurality of measurement positions are averaged to obtain a thickness of the refractive index adjustment zone 13b.

FIG. 3 is a sectional view depicting an embodiment in which the pressure-sensitive adhesive layer 13 depicted in FIG. 2 is applied to a configuration obtained by forming a patterned transparent electroconductive layer 7 such as a patterned ITO film, on a pressure-sensitive adhesive layer-side surface of the second optical element 4, so as to make up a touch panel sensor. In this case, examples of the second optical element 4 may include a glass substrate of a display panel, for example, in a liquid crystal display device or an organic EL display device.

Figure 4:
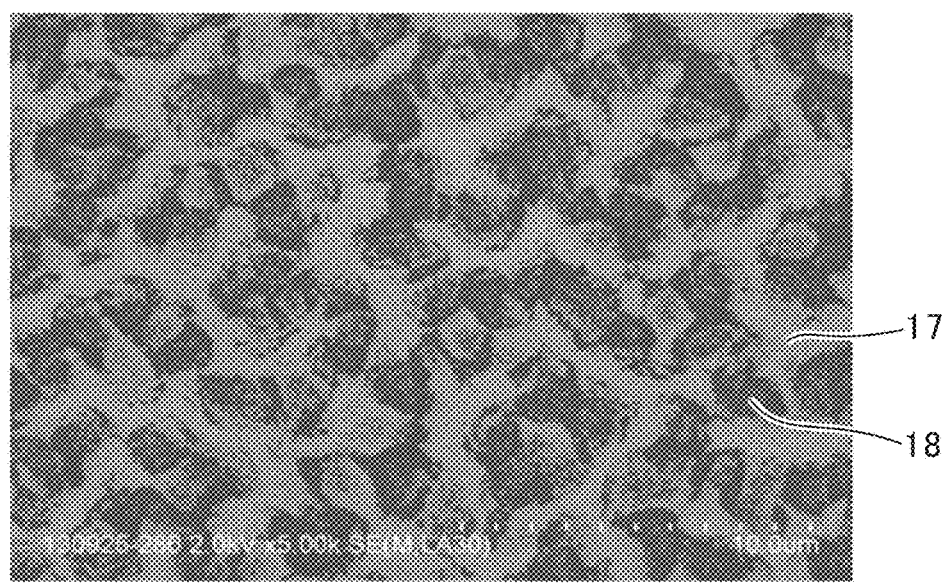
FIG. 4 is a top plan view depicting a state of a principal surface of the pressure-sensitive adhesive layer which is in contact with a second optical element.

As depicted in FIG. 3, the principal surface 16 of the refractive index adjustment zone 13b of the pressure-sensitive adhesive layer 13 is bonded to respective pressure-sensitive adhesive layer-side surfaces of the second optical element 4 and the transparent electroconductive layer 7 in such a manner as to fill up a stepped space between the second optical element 4 and the transparent electroconductive layer 7. FIG. 4 is a top plan view depicting a state of the principal surface 16 of the pressure-sensitive adhesive layer 13 in contact with the second optical element 4. As depicted in FIG. 4, a microstructure of the principal surface 16 is formed in a sea-island structure where the high refractive index material particles 17 are dispersed in a matrix 18 of the base pressure-sensitive adhesive material in the form of islands. In a contact surface of the pressure-sensitive adhesive layer 13 with the second optical element 4, there are a region where the base pressure-sensitive adhesive material is in contact with the second optical element 4 and a region where the high refractive index material particles 17 are in contact with the second optical element 4. Preferably, a ratio of an area of the high refractive index material particles 17 to a total area of the high refractive index material particles 17 and the base pressure-sensitive adhesive material at the above position is set in the range of 30 to 99%.

The area ratio is calculated by measuring an area of the high refractive index material particles 17 in each of a plurality of square regions having a side length of 10 μm to 200 μm to obtain a ratio of the area of the high refractive index material particles 17 to the entire area of the square region, and averaging the area ratios measured in the plurality of square regions.

Figure 5A:
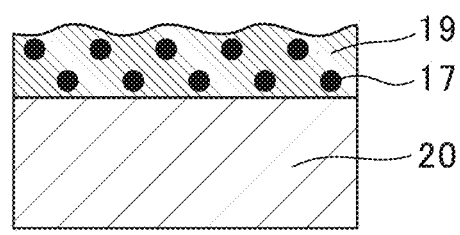
FIG. 5(a) is a schematic diagram illustrating a step of application of a dispersion liquid, in a process for preparing the pressure-sensitive adhesive layer depicted in FIG. 2.
Figure 5B:
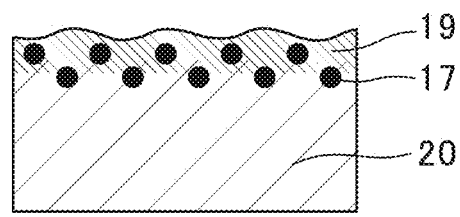
FIG. 5(b) is a schematic diagram illustrating a step of infiltration with high refractive index material particles, in the process for preparing the pressure-sensitive adhesive layer depicted in FIG. 2.
Figure 5C:
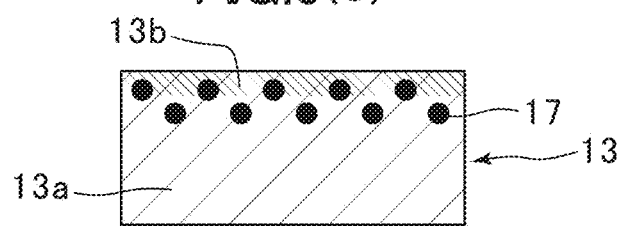
FIG. 5(c) is a schematic diagram illustrating a drying step, in the process for preparing the pressure-sensitive adhesive layer depicted in FIG. 2.

FIGS. 5(a), 5(b) and 5(c) schematically depict a process of producing the pressure-sensitive adhesive layer 13 in FIG. 2. First of all, a dispersion liquid 19 obtained by dispersing the above high refractive index material particles 17 in a dispersion medium, and a base pressure-sensitive adhesive material layer 20, are preliminarily prepared. Then, as depicted in FIG. 5(a), the dispersion liquid 19 is applied to a surface of the base pressure-sensitive adhesive material layer 20. Thus, the surface of the base pressure-sensitive adhesive material layer 20 is swelled by the dispersion medium of the dispersion liquid 19, and, in this process, the high refractive index material particles 17 in the dispersion liquid 19 infiltrate into the base pressure-sensitive adhesive material layer 20 in the thickness direction. This state is depicted in FIG. 5(b). Subsequently, the resulting base pressure-sensitive adhesive material layer 20 is dried to vaporize the dispersion medium of the dispersion liquid 19 to obtain the pressure-sensitive adhesive layer 13 depicted in FIG. 2, i.e., a refractive index adjustment zone-formed pressure-sensitive adhesive layer. This state is depicted in FIG. 5(c).

An infiltration depth of the high refractive index material particles 17 with respect to the base pressure-sensitive adhesive material layer 20 is determined by a relationship between the base pressure-sensitive adhesive material and the dispersion medium of the dispersion liquid 19. The dispersion medium may be appropriately selected to enable the infiltration depth (thickness of the refractive index adjustment zone) to become the aforementioned value.

EXAMPLES

The present invention will be further described below, based on examples.
[Production of Base Pressure-Sensitive Adhesive Materials]
<Production of Acrylic Oligomer>

60 weight parts of dicyclopentanyl methacrylate (DCPMA), 40 weight parts of methyl methacrylate (MMA), 3.5 weight parts of α-thioglycerol as a chain transfer agent, and 100 weight parts of toluene as a polymerization medium were put into a four-neck flask, and stirred in a nitrogen atmosphere at 70° C. for 1 hour. Then, 0.2 weight parts of 2,2'-zobisisobutyronitrile as a polymerization initiator was put into the four-neck flask to induce a reaction at 70° C. for 2 hours, followed by a further reaction at 80° C. for 2 hours. Then, the resulting reaction solution was placed in an atmosphere at 130° C. to remove the toluene, the chain transfer agent and unreacted monomers therefrom by drying to thereby obtain an acrylic-based polymer in a solid form. The acrylic-based polymer obtained in this manner was named as "acrylic-based polymer (A-1)". This acrylic-based polymer (A-1) had a weight-average molecular weight (Mw) of $5.1 \times 10^3$.

<Production of Base Pressure-Sensitive Adhesive Material A>

0.035 weight parts of a photopolymerization initiator (trade name: "IRGACURE 184", manufactured by BASF SE.) and 0.035 weight parts of a photopolymerization initiator (trade name "IRGACURE 651" manufactured by BASF SE.) were added to a monomer mixture of 68 weight parts of 2-ethylhexyl acrylate (2EHA), 14.5 weight parts of N-vinyl-2-pyrrolidone (NVP) and 17.5 weight parts of 2-hydroxyethyl acrylate (HEA), and then the resulting monomer mixture was exposed to ultraviolet light in a nitrogen atmosphere in such a manner as to be partially photopolymerized, thereby obtaining a partially polymerized product having a polymerization rate of about 10 weight % (acrylic-based polymer syrup).

Then, 5 weight parts of the acrylic-based polymer (A-1), 0.15 weight parts of hexanediol diacrylate (HDDA) and 0.3 weight parts of a silane coupling agent (trade name: "KBM-403", manufactured by Shin-Etsu Chemical Co., Ltd.) were added to and uniformly mixed with the acrylic-based polymer syrup obtained in the above manner to obtain an acrylic-based pressure-sensitive adhesive composition. The acrylic-based pressure-sensitive adhesive composition was applied onto a release-treated surface of a separator film (trade name: "DIAFOIL MRF#38", manufactured by Mitsubishi Plastics, Inc.) in such a manner that a thickness thereof after being formed as a base pressure-sensitive adhesive material layer becomes 150 μm, thereby forming a pressure-sensitive adhesive composition layer. Then, a separator film (trade name: "DIAFOIL MRF#38", manufactured by Mitsubishi Plastics, Inc.) was attached onto a surface of the pressure-sensitive adhesive composition layer in such a manner that a release-treated surface of this separator film faces the applied layer. In this way, the applied layer of the monomeric components is blocked from oxygen. Subsequently, the pressure-sensitive adhesive composition layer was photocured by irradiation with ultraviolet light under conditions including an illuminance of 5 mW/cm$^2$ and a light intensity of 1,500 mJ/cm$^2$, to form a layer of a base pressure-sensitive adhesive martial A.

<Production of Base Pressure-Sensitive Adhesive Material B>

28.5 weight parts of 2-ethylhexyl acrylate (2EHA), 28.5 weight parts of isostearyl acrylate (ISTA), 22 weight parts of isobornyl acrylate, 20 weight parts of 4-hydroxybutyl acrylate (4HBA), and two types of photopolymerization initiators: 0.05 weight parts of a photopolymerization initiator (trade name: "IRGACURE 184", manufactured by BASF SE.) and 0.05 weight parts of a photopolymerization initiator (trade name: "IRGACURE 651", manufactured by BASF) were mixed together, and the resulting monomer mixture was exposed to ultraviolet light in a nitrogen atmosphere in such a manner as to be partially photopolymerized, thereby obtaining a partially polymerized product (acrylic-based polymer syrup) having a polymerization rate of about 10 weight %.

Then, 0.3 weight parts of hexanediol diacrylate (HDDA) and 0.3 weight parts of a silane coupling agent (trade name: "KBM-403", manufactured by Shin-Etsu Chemical Co., Ltd.) were added to and evenly mixed with the acrylic-based polymer syrup obtained in the above manner to obtain an acrylic-based pressure-sensitive adhesive composition. The acrylic-based pressure-sensitive adhesive composition was applied onto a release-treated surface of a separator film (trade name: "DIAFOIL MRF#38", manufactured by Mitsubishi Plastics, Inc.) in such a manner that a thickness thereof after being formed as a base pressure-sensitive adhesive material layer becomes 100 μm, thereby forming a pressure-sensitive adhesive composition layer. Then, a separator film (trade name: "DIAFOIL MRF#38", manufactured by Mitsubishi Plastics, Inc.) was attached onto a surface of the pressure-sensitive adhesive composition layer in such a manner that a release-treated surface of this separator film faces the applied layer. In this way, the applied layer of the monomer components is blocked from oxygen. Subsequently, the pressure-sensitive adhesive composition layer was photocured by irradiation with ultraviolet light under conditions including an illuminance of 5 mW/cm$^2$ and a light intensity of 1,500 mJ/cm$^2$, to form a layer of a base pressure-sensitive adhesive material B.

<Production of Base Pressure-Sensitive Adhesive Material C>

63 weight parts of 2-ethylhexyl acrylate (2EHA), 15 weight parts of N-vinyl-2-pyrrolidone (NVP), 9 weight parts of methyl methacrylate (MMA) and 13 weight parts of hydroxyethyl acrylate (HEA) each serving as a monomer component were put into a separable flask equipped with a thermometer, a stirring device, a reflux cooling tube and a nitrogen introducing tube, and 200 weight parts of ethyl acetate serving as a polymerization medium was further put into the separable flask. The resulting mixture was stirred for 1 hour, under introduction of nitrogen gas. In this way, oxygen in a polymerizing system was removed. Then, 0.2 weight parts of 2,2'-zobisisobutyronitrile as a polymerization initiator was added, and the resulting mixture was heated to 60° C. to induce a reaction for 10 hours. Then, toluene was added to obtain an acrylic-based polymer solution having a solid content concentration of 30 weight %. The obtained acrylic-based polymer solution had a weight-average molecular weight (Mw) of 800,000. 1.0 parts of trimethylolpropane-xylylene diisocyanate ("Takenate D110N" manufactured by Mitsui Chemicals, Inc.) serving as an isocyanate-based cross-linking agent, and 0.2 parts of a silane coupling agent ("KBM-403" produced by Shin-Etsu Chemical Co., Ltd.) were added to the above acrylic-based polymer solution (solid content: 100 parts) to prepare a pressure-sensitive adhesive composition (solution). The pressure-sensitive adhesive solution prepared in the above manner was applied onto a release-treated surface of a separator film (trade name: "DIAFOIL MRF#75", manufactured by Mitsubishi Plastics, Inc.) in such a manner that a thickness thereof after being formed as a base pressure-sensitive adhesive material layer becomes 75 μm. Then, the applied solution was heated and dried under normal pressures at 60° C. for 3 minutes and further at 155° C. for 4 minutes, and the dried layer was subjected to aging at 50° C. for 72 hours to produce a layer of a base pressure-sensitive adhesive material C.

[Production of Refractive Index Adjustment Zone-Formed Pressure-Sensitive Adhesives]

<Case of Using Base Pressure-Sensitive Adhesive Material A & High Refractive Index Material Nanoparticle Dispersion Liquid>

(Case of using base pressure-sensitive adhesive material A & nanoparticle dispersion liquid (dispersion medium: ethanol))

A 150 μm-thick base pressure-sensitive adhesive material layer A (refractive index: 1.49) having opposite surfaces each protected by a lightly-peelable PET separator sheet was prepared, and one of the PET separator sheets was peeled off. A coating liquid (dispersion medium: ethanol, particle concentration: 1.5 weight %, transmittance of dispersion liquid: 82%; manufactured by CIK Nanotech Co., Ltd.) containing zirconia particles ($ZrO_2$, refractive index: 2.17, average primary particle size: 20 nm), as a dispersion liquid containing high refractive index material particles, was applied to the exposed surface of the base pressure-sensitive adhesive material layer by using a bar coater RDS No. 5 in such a manner as to form a refractive index adjustment zone having a thickness of 20 nm to 200 nm, and dried in a drying oven at 110° C. for 180 seconds. Then, a PET separator sheet (75 μm) serving as a support (backing) was attached onto a surface of the resulting pressure-sensitive adhesive layer, from which the zirconia ($ZrO_2$) particles were dispersed, to thereby obtain a refractive index adjustment zone-formed pressure-sensitive adhesive (A1) (also termed "refractive index adjustment zone-formed pressure-sensitive adhesive sheet (A1)"). The refractive index adjustment zone had a thickness of 140 nm. An average primary particle size of the zirconia particles was measured by TEM observation.

Other Examples

Using the following base pressure-sensitive adhesive material layers and high refractive index material nanoparticle dispersion liquid, a refractive index adjustment zone-formed pressure-sensitive adhesive (B1) and a refractive index adjustment zone-formed pressure-sensitive adhesive (C1) (also termed, respectively, "refractive index adjustment zone-formed pressure-sensitive adhesive sheet (B1)" and "refractive index adjustment zone-formed pressure-sensitive adhesive sheet (C1)") were produced in the same manner as that in the above case. The base pressure-sensitive adhesive materials used were the base pressure-sensitive adhesive material B (refractive index: 1.48) and the base pressure-sensitive adhesive material C (refractive index: 1.49), and the high refractive index material nanoparticle dispersion liquid used was $ZrO_2$ nanoparticle dispersion liquid (dispersion medium: ethanol, particle size: 20 nm). The refractive index adjustment zone of the refractive index adjustment zone-formed pressure-sensitive adhesive (B1) had a thickness of 120 nm, and the refractive index adjustment zone of the refractive index adjustment zone-formed pressure-sensitive adhesive (C1) had a thickness of 200 nm.

A surface of the separator sheet (separator) to be bonded to the refractive index adjustment zone is subjected to release treatment. Further, the separator sheet requires mechanical strength as a carrier sheet. In the case where the transparent electroconductive layer is made of ITO, the separator sheet preferably has heat resistance capable of withstanding a high-temperature crystallization process, and excellent dimensional stability. It may be made of a material such as cycloolefin-based resin, polyester-based resin, polycarbonate-based resin, or polyolefin-based resin, more specifically, such as PET, polycarbonate (PC) or COP (ZE-ONOA).

Aside from the release treatment, the separator sheet (separator) may have a single-or multi-layered functional layer on one or each of the opposite surfaces thereof. Examples of the functional layer include a hard coat (HC) layer, an oligomer blocking layer, an anti-blocking (AB) layer and an anti-static layer. The functional layer may be formed by arbitrarily combining two or more of them. From a viewpoint of thickness reduction, the separator sheet is preferably thinned However, an excessively small thickness thereof leads to insufficiency of mechanical strength, and difficulty in handling. On the other hand, an excessively large thickness thereof leads to difficulty in handling of a raw material strip thereof, e.g., when it is wound into a roll, possibly impairing productivity. Thus, the thickness thereof is set in the range of 2 to 200 μm, preferably in the range of 10 to 125 μm.

Respective configurations and features of the refractive index adjustment zone-formed pressure-sensitive adhesive sheets present in the following table.

TABLE 1

| Refractive Index Adjustment Zone-Formed Pressure-Sensitive Adhesive | Base Pressure-Sensitive Adhesive Type | Thickness μm | High Refractive Index Material | Production Method | Properties of Refractive Index Adjustment Zone in Laminate | | | | |
|---|---|---|---|---|---|---|---|---|---|
| | | | | | Average Interfacial Refractive Index $n_D$ | Thickness of High Refractive Index Layer in Cross-sectional TEM observation [nm] | Total Light Transmittance | Haze Value | Adhesive Force at Surface of Refractive Index Adjustment Zone [N/25 mm] |
| Refractive index adjustment zone-formed pressure-sensitive | (A) Refractive index: 1.49 | 150 | Zirconium oxide (average particle size 20 nm) | Applying ethanol dispersion liquid of zirconium oxide particle (Solid content: 1.2 wt %, Transmittance of | 1.66 | 140 | 92.3 | 0.6 | 16 |
| Refractive index adjustment zone-formed pressure-sensitive | (B) Refractive index: 1.48 | 100 | Zirconium oxide (average particle size 20 nm) | Applying ethanol dispersion liquid of zirconium oxide particle (Solid content: 1.2 wt %, Transmittance of | 1.75 | 120 | 92.3 | 0.4 | 12 |
| Refractive index adjustment zone-formed pressure-sensitive | (C) Refractive index: 1.49 | 75 | Zirconium oxide (average particle size 20 nm) | Applying ethanol dispersion liquid of zirconium oxide particle (Solid content: 1.2 wt %, Transmittance of | 1.62 | 200 | 92.3 | 0.5 | 11 |

Preferably, the base pressure-sensitive adhesive material is excellent in optical transparency, adhesiveness, and cohesive property (processability). For example, in the case where the transparent electroconductive layer is made of ITO, the base pressure-sensitive adhesive material preferably has heat resistance capable of withstanding a high-temperature crystallization process. For example, as the base pressure-sensitive adhesive material, it is possible to use one or more appropriately selected from the group consisting of an acrylic-based pressure-sensitive adhesive, a rubber-based pressure-sensitive adhesive, a silicone-based pressure-sensitive adhesive, a polyester-based pressure-sensitive adhesive, a urethane-based pressure-sensitive adhesive, an epoxy-based pressure-sensitive adhesive, and a polyether-based pressure-sensitive adhesive. From a viewpoint of exhibiting excellent optical transparency, excellent adherence properties such as cohesive property and adhesiveness, excellent weather resistance and heat resistance and others, an acrylic-based pressure-sensitive adhesive is preferably used.

Preferably, the refractive index adjustment zone is made of a material having a refractive index greater than a refractive index of the base pressure-sensitive adhesive material. From a viewpoint of durability under high temperature or high temperature and high humidity, it is preferable to use an inorganic high refractive index material, instead of a resin material. It is possible to use one or more compounds selected from the group consisting of $TiO_2$, $ZrO_2$, $CeO_2$, $Al_2O_3$, $BaTiO_2$, $Nb_2O_5$ and $SnO_2$. Preferably, the high refractive index material particles have an average primary particle size of 3 nm to 100 nm. The thickness of the refractive index adjustment zone is preferably in the range of 20 nm to 600 nm, more preferably, in the range of 20 nm to 300 nm, furthermore preferably, in the range of 20 nm to 200 nm.

[Production of Double-Sided Transparent Electroconductive Film Laminate]

<Production of Transparent Electroconductive Layer Using COP as Film Substrate (Production of Double-Sided Transparent Electroconductive Film (1)>

A coating liquid obtained by adding 0.07 parts of a plurality of 3 μm-diameter particles (trade name: "SS×105", manufactured by Sekisui Jushi Corp.) to 100 parts of binder resin (trade mark "UNIDIC RS29-120", manufactured by DIC Corp.) was applied to each of opposite surfaces of a 100 μm-thick cyclo-olefin polymer (COP) film (trade name: "ZEONOA ZF16", manufactured by Nippon Zeon Co., Ltd., in-plane birefringence: 0.0001) by using a bar coater, and dried in an oven at 80° C. for 1 minute. Then, each surface of the resulting film was irradiated with ultraviolet light (high-pressure mercury vapor lamp) with an integrated light intensity of 300 mJ/cm$^2$, thereby forming a film having anti-blocking layers on respective opposite surfaces thereof (this film will hereinafter be referred to as "COP substrate"). Then, a refractive index adjuster (trade name: "OPSTAR KZ6661", manufactured by JSR Corp.) was applied to respective surfaces of the anti-blocking layers by using a bar coater, and, after being dried in an oven at 80° C. for 1 minute, irradiated with ultraviolet light (high-pressure mercury vapor lamp) with an integrated light intensity of 300 mJ/cm$^2$, so that it was formed as a 100 nm-thick refractive index adjustment layer having a refractive index of 1.65 (the resulting refractive index adjustment layers will hereinafter be deemed to be comprised in the COP substrate). Then, a 23 nm-thick indium tin oxide (ITO) layer serving as a transparent electroconductive layer was deposited on respective surfaces of the refractive index adjustment layers of the COP substrate, by using a winding type sputtering apparatus. The transparent electroconductive layers produced in this manner is equivalent to a double-sided transparent electroconductive film (1) depicted in FIG. 7(a). Details thereof will be described later.

<Production of Transparent Electroconductive Layer Using PET as Film Substrate (Production of Double-Sided Transparent Electroconductive Film (2)>

Except that the material for the film substrate was changed to polyethylene terephthalate (PET), a film substrate (hereinafter referred to as "PET substrate") having refractive index adjustment layers, respectively, on opposite surfaces thereof was produced in the same manner as that described above. Then, a 23 nm-thick indium tin oxide (ITO) layer serving as a transparent electroconductive layer was deposited on respective surfaces of the refractive index adjustment layers of the obtained PET substrate, by using a winding type sputtering apparatus. The transparent electroconductive layers produced in this manner is equivalent to a double-sided transparent electroconductive film (2) depicted in FIG. 7(b). Details thereof will be described later.

The transparent electroconductive layer is preferably made of a material having transparency (invisibility) in addition to electroconductive property, and capable of being patterned. Examples of the material include a silver nanowire and a metal mesh (silver, copper), in addition to ITO. Preferably, the transparent film substrate has high transparency (high transmittance, low haze). Further, in the case where the transparent electroconductive layer is made of ITO, the transparent film substrate preferably has heat resistance capable of withstanding a high-temperature crystallization process. Preferably, the transparent film substrate is also excellent in etching resistance (chemical resistance), dimensional stability, processability and handleability.

As a material for the transparent film substrate, it is possible to use cycloolefin-based resin, polyester-based resin, polycarbonate-based resin, or polyolefin-based resin, such as PET, polycarbonate (PC) or COP (ZEONOA). The film substrate may have a single-or multi-layered functional layer on one or each of the opposite surfaces thereof. Examples of the functional layer include an easy-adhesion layer, a hard coat (HC) layer, an oligomer blocking layer, a refractive index adjustment (film substrate IM) layer, an anti-blocking (AB) layer and a moisture barrier layer made of $SiO_2$ or the like. The functional layer may be formed by arbitrarily combining two or more of them. The surface of the transparent film substrate may be preliminarily subjected to sputtering, corona discharge, flame, ultraviolet irradiation, electron beam irradiation, chemical conversion, etching such as oxidation, or undercoating to improve adhesion with respect to the functional layer to be formed on the film substrate. Further, as necessary, before forming the functional layer, the surface of the transparent film substrate may be subjected to dust removing and cleaning by means of solvent cleaning or ultrasonic cleaning.

In a configuration where the transparent film substrate is disposed on an outer side (viewing side) of an image display device using a polarizing plate, the transparent film substrate is composed of a λ/4 plate, and disposed such that a slow axis of the transparent film substrate is angled at 45 degrees with respect to a polarization axis of the polarizing plate located on the outer side (viewing side), whereby linearly-polarized light exiting from the image display device can be converted into circularly-polarized light. Thus, even when viewing through polarized sunglasses, it becomes possible to prevent user's vision from being completely darkened. Further, when obliquely viewing the transparent film substrate such as a PET substrate, birefringence of the PET substrate is likely to cause rainbow-like unevenness. This can be improved by using a birefringence-free optically-isotropic film as the film substrate.

From a viewpoint of thickness reduction, the transparent film substrate is preferably thinned However, an excessively small thickness thereof leads to insufficiency of mechanical strength, and difficulty in processing and handling. On the other hand, an excessively large thickness thereof leads to difficulty in handling of a raw material strip thereof, e.g., when it is wound into a roll, possibly impairing productivity. Thus, the thickness of the transparent film substrate is set in the range of 2 to 200 μm, preferably in the range of 10 to 125 μm.

A protective film is preferably formed of a polyethylene terephthalate (PET) film, a triacetyl cellulose (TAC) film or an optically isotropic film. The protective film may have a functional layer on a surface thereof on a side opposite to the pressure-sensitive adhesive sheet. Examples of the functional layer include a hard coat (HC) layer, an anti-blocking (AB) layer, an anti-reflection layer, an anti-static layer, and a treated layer for the purpose of diffusion or anti-glare. The functional layer may be formed by arbitrarily combining two or more of them. In the case where there is an air layer between the protective layer and an image display device (LCD, OLED), the anti-reflection layer may be disposed so as to prevent internal reflection at an interface between the air layer and the protective film.

<Production of Optical Element Laminate Functioning as Touch Panel Sensor>

After forming a photoresist film on a part of a surface of the transparent electroconductive layer and the transparent electroconductive film laminate (i.e., at least one of the transparent electroconductive layers of the double-sided transparent electroconductive film), the resulting film was immersed in an aqueous hydrogen chloride solution (hydrochloric acid concentration: 5 weight %) at 25° C., for 1 minute, to subject the transparent electroconductive layer to etching. Through the etching, at least one of the transparent electroconductive layers was processed such that a part thereof corresponding to an electrode wiring pattern is left as a patterned portion, and the remaining part is removed to form an opening. After peeling off the PET separator sheet on one surface of the aforementioned pressure-sensitive adhesive sheet having the high refractive index material particles, the pressure-sensitive adhesive sheet was laminated to the patted transparent electroconductive layer, such that one of the pressure-sensitive adhesive sublayers (the surface of the pressure-sensitive adhesive layer having the high refractive index material particles) of the pressure-sensitive adhesive sheet is brought into contact with the patterned transparent electroconductive layer. Then, after peeling off the PET separator sheet on the other surface of the pressure-sensitive adhesive sheet, a glass slide or a 100 μm-thick cycloolefin polymer film (trade name: "ZEONOA ZF16", manufactured by Nippon Zeon Co., Ltd., in-plane birefringence: 0.0001) was laminated to the resulting exposed surface for the purpose of surface protection and optical measurement. Details of Inventive Examples 1 to 4 produced in this manner and aftermentioned Comparative Examples 1 to 4 will be described later with reference to FIGS. 9(a) to 9(d) and FIGS. 10(a) to 10(d).

[Evaluation Method]

<Observation of Surface State of Pressure-Sensitive Adhesive Layer>

Figure 11:
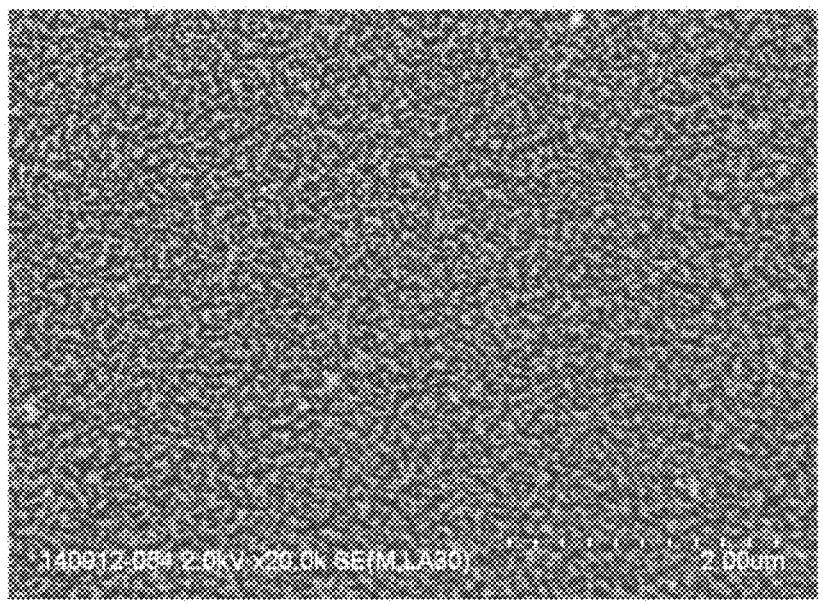
FIG. 11 is a 20000× SEM photograph presenting a surface state of a refractive index adjustment zone of a pressure-sensitive adhesive layer produced in one Inventive Example.

In each Inventive Example, the surface of the pressure-sensitive adhesive layer having the high refractive index material particles was observed using a field emission scanning electron microscope (FE-SEM) at an acceleration voltage of 2 kV, and at respective magnifications: 500 times, 2,000 times, 5,000 times and 20,000 times. A SEM photograph at a magnification of 20,000 times is presented in FIG. 11. The SEM photograph shows that the high refractive index material particles are uniformly dispersed.

<Observation of Gradation-Processed Microstructure>

Figure 12A:
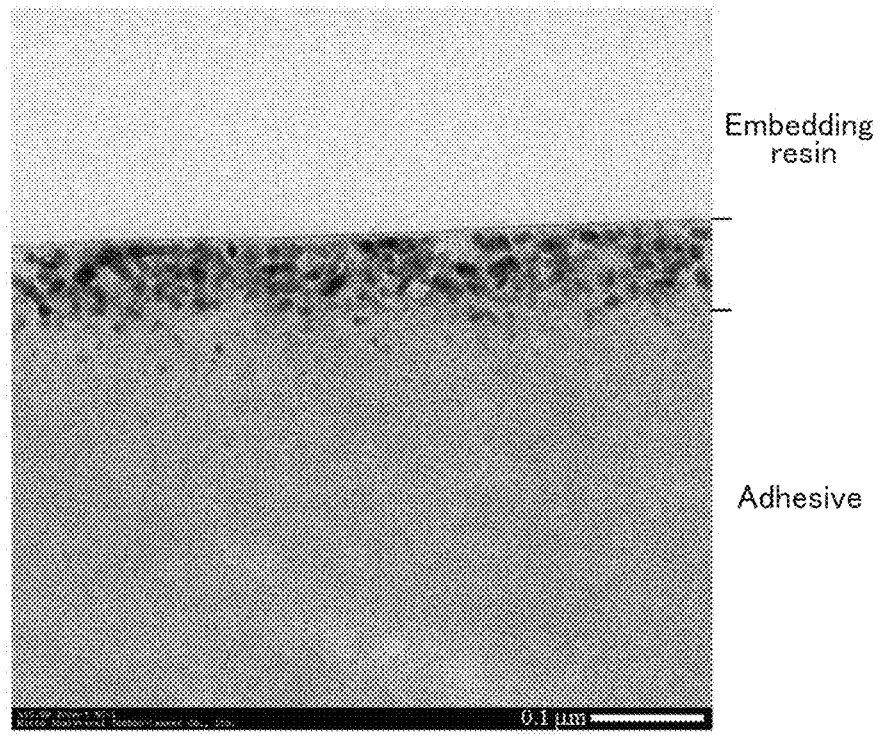
FIG. 12(a) is a 30000× TEM cross-sectional photograph presenting a high refractive index material particle distribution in a refractive index adjustment zone of a pressure-sensitive adhesive layer obtained in another Inventive Example.
Figure 12B:
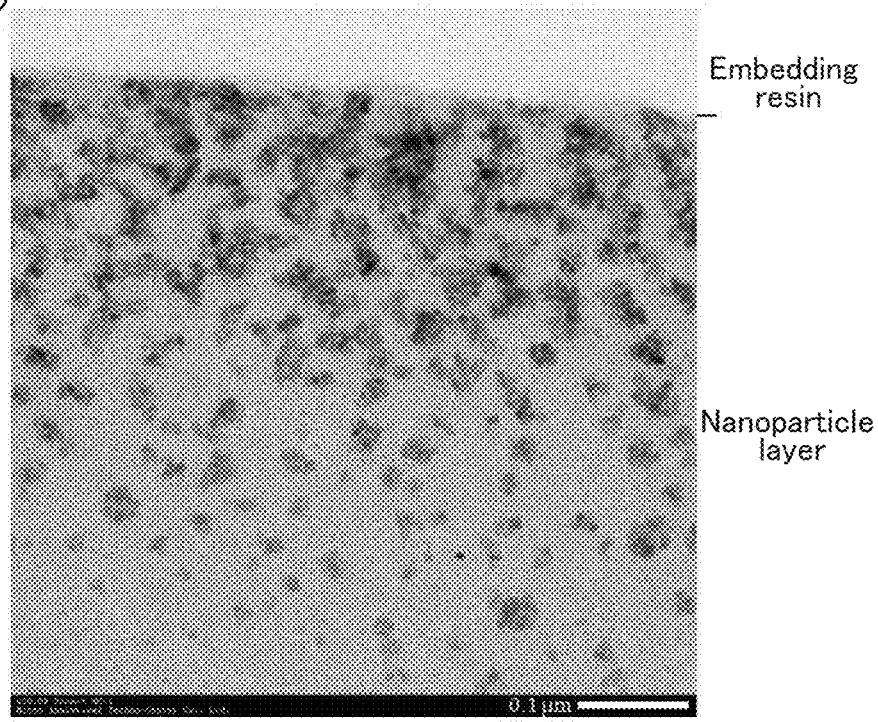
FIG. 12(b) is a 30000× TEM cross-sectional photograph presenting a high refractive index material particle distribution in a refractive index adjustment zone of a pressure-sensitive adhesive layer obtained in another Inventive Example.

In two Inventive Examples, a cross-section adjacent to the surface of the pressure-sensitive adhesive layer having the high refractive index material particles was observed using a transmission electron microscope (TEM) at a magnification of 30,000 times. Results of the observation are presented in FIGS. 12(a) and 12(b). FIG. 12(a) shows that the high refractive index material particles are approximately uniformly distributed over approximately the entire thickness of the refractive index adjustment zone, whereas FIG. 12(b) shows that a distribution density of the high refractive index material particles in the pressure-sensitive adhesive layer is maximized at one surface of the pressure-sensitive adhesive layer, and gradually reduced toward the other surface in a thickness direction of the pressure-sensitive adhesive layer.

<Average Interfacial Refractive Index>

An average interfacial refractive index of the pressure-sensitive adhesive layer obtained in each of Inventive Examples and an average interfacial refractive index of the base pressure-sensitive adhesive material layer obtained in each of Comparative Examples were calculated by measuring refractive indexes in the sodium D-lines (589 nm) using a spectroscopic ellipsometer ("EC-400" manufactured by JA. Woolam Co.). In each of the pressure-sensitive adhesive layers of Inventive and Comparative Examples, the separator sheets on the opposite surfaces of the pressure-sensitive adhesive layer were peeled off, and a black plate was laminated to a non-particle infiltration-side one of the surfaces. In this state, an average interfacial refractive index at the other surface, i.e., the particle infiltration-side surface, was measured. On the other hand, in each of the pressure-sensitive adhesive layers (base pressure-sensitive adhesive material layers) of Comparative Examples, two separator sheets on respective opposite surfaces of the pressure-sensitive adhesive layer were peeled off, and then a black plate was laminated to one of the surfaces. In this state, an average interfacial refractive index at the other surface of the pressure-sensitive adhesive layer was measured.

<Measurement of Thickness of Refractive Index Adjustment Sublayer (Zone)>

A cross-section of the pressure-sensitive adhesive layer in a depth direction was adjusted to perform TEM observation. Based on the resulting TEM image (direct magnification: 3,000 to 30,000 times), a thickness of the refractive index adjustment sublayer was measured. The thickness of the refractive index adjustment sublayer was determined as an average value of undulation of the interface between the base adhesive zone (sublayer) and the refractive index adjustment sublayer. In a situation where it was difficult to identify the interface between the base adhesive zone and the refractive index adjustment zone, an interfacial TEM image was subjected to binary image processing using image processing software (Image J), and a depth in a region where 90% of the nanoparticles exists was determined as the thickness of the refractive index adjustment sublayer.

<Area Ratio of High Refractive Index Material Particles>

The particle infiltration-side surface of the pressure-sensitive adhesive layer was observed using FE-SEM at an acceleration voltage of 2 kV, and at respective magnifications: 500 times, 2,000 times and 5,000 times. The resulting interfacial SEM image was subjected to binary image processing using image processing software (ImageJ) to measure an area of the high refractive index material particles in a rectangular region having a long side length of 23 μm and a short side length of 18 μm so as to calculate an area ratio (%) of the high refractive index material particles to the entire rectangular region.

<Total Light Transmittance & Haze Value>

In each of the pressure-sensitive adhesive sheets obtained in Inventive and Comparative Examples, a particle infiltration-side one of the separator sheets was peeled off, and the resulting exposed surface was attached to a glass slide (trade name: "ShiroKenma No. 1", manufactured by Matsunami Glass Ind., Ltd., thickness: 0.8 to 1.0 mm, total light transmittance: 92%, haze: 0.2%). Then, the other separator sheet was further peeled off to produce a test piece having a three-layered structure of the base adhesive sublayer, the refractive index adjustment sublayer, and the glass slide. On the other hand, in each of the pressure-sensitive adhesive sheets obtained in Comparative Examples, one of the separator sheets was peeled off, and the resulting exposed surface was attached to a glass slide (trade name: "ShiroKenma No. 1", manufactured by Matsunami Glass Ind., Ltd., thickness: 0.8 to 1.0 mm, total light transmittance: 92%, haze: 0.2%). Then, the other separator sheet was further peeled off to prepare a test piece having a two-layered structure of the base pressure-sensitive adhesive material layer and the glass slide. For each of the test pieces, a total light transmittance and a haze value in a visual light range were measured using a haze meter (device name: HM-150, manufactured by Murakami Color Research Laboratory Co., Ltd).

<Adhesive Force During 180-Degree Peeling (Adhesive Force with Respect to Glass Plate During 180-Degree Peeling>

A piece having a length of 100 mm and a width of 25 mm was cut from each of the pressure-sensitive adhesive sheets obtained in Inventive and Comparative Examples. Then, in each of the cut pieces of Inventive and Comparative Examples, a non-particle infiltration-side one of the separator sheets was peeled off, and a PET film (trade name: "LUMIRROR S-10", manufactured by TORAY Industries Inc., thickness: 25 μm) was attached (lined) to the exposed surface. On the other hand, in each of the cut pieces of Comparative Examples 1 and 2, one of the separator sheets was peeled off, and a PET film (trade name: "LUMIRROR S-10", manufactured by TORAY Industries Inc., thickness: 25 μm) was attached (lined) to the exposed surface. Subsequently, the other separator sheet was peeled off, and then the cut piece was press-bonded to a glass plate (trade name: "Soda-Lime Glass #0050", manufactured by Matsunami Glass Ind., Ltd.) as a test plate, under press-bonding conditions: 2 kg roller; and one stroke, to produced a sample having a three-layered structure of the test plate, the pressure-sensitive adhesive layer (or the base pressure-sensitive adhesive material layer), and the PET film.

Each of the obtained samples was subjected to an autoclave treatment (50° C., 0.5 MPa, 15 minutes), and then subjected to cooling in an atmosphere at 23° C. and 50% R.H., for 30 minutes. After the cooling, the pressure-sensitive adhesive sheet (the pressure-sensitive adhesive layer and one PET film) was peeled off from the test plate to measure an adhesive force (N/25 mm) during 180-degree peeling, using a tension tester (device name: Autograph, manufactured by Shimadzu Corp.) according to JIS Z0237, in an atmosphere at 23° C. and 50% R.H., under conditions including a tension rate of 300 mm/minute and a peeling angle of 180 degrees. Further, in each of Inventive and Comparative Examples, a pressure-sensitive adhesive sheet of the base pressure-sensitive adhesive material before the infiltration of the high refractive index material particles was prepared, and an adhesive force during 180-degree peeling was measured in the same manner as above.

<Transmittance of High Refractive Index Particle-Containing Dispersion Liquid>

A transmittance of the high refractive index particle-containing dispersion liquid was measured by a photoelectrometer (AC-114 manufactured by Optima Inc.) using a 530 nm filter. On the assumption that a transmittance of the dispersion medium itself is 100%, a transmittance (%) of the dispersion liquid used in Inventive and Comparative Examples was calculated.

<Measurement of Reflection Suppression Rate>

A sample for reflectance measurement was prepared such that one of the opposite surfaces of each of the optical element laminates in Inventive and Comparative Examples was used as a reflectance measuring surface, and a single-sided pressure-sensitive adhesive black PET sheet (PET75NBPET38, manufactured by Lintec Corporation) was attached to the other surface. A reflectance (Y value) of the reflectance measuring surface of the optical element laminate was measured by spectrophotometer (U4100, Hitachi High Technologies Co., Ltd). The measurement was performed at respective positions corresponding to an etched area and a non-etched area of the transparent electroconductive layer. That is, in the etched area (opening) of the transparent electroconductive layer, a reflectance at an interface between the refractive index adjustment sublayer of the pressure-sensitive adhesive layer and the refractive index adjustment layer of the optical element laminate was measured. Further, in the non-etched area (patterned portion) of the transparent electroconductive layer, a reflectance at an interface between the refractive index adjustment sublayer of the pressure-sensitive adhesive layer and the transparent electroconductive layer was measured.

For each of the etched area and the non-etched area, a reflection suppression rate was calculated based on the following formula. In the following formula, "reflectance (%) in case devoid of the particles" means a reflectance of each of the optical element laminates in Comparative Examples (using no particle). That is, the reflection suppression rate is an index indicating how much the reflectance can be reduced by providing the refractive index adjustment sublayer.

Reflection suppression rate (%)=reflectance (%)–reflectance (%) in case devoid of the particles

[Sensor Configuration in Case of Application to Double-Sided ITO Film (G/FD)]

A laminate 21 depicted in FIG. 6(a) is a double-sided ITO film laminate sensor comprising two refractive index adjustment zone-formed pressure-sensitive adhesive layers (IM sublayer-formed pressure-sensitive adhesive layers 22) each forming the basis of the present invention. Fundamentally, the double-sided ITO film laminate sensor according to the present invention is formed by attaching one-side surfaces of the refractive index adjustment zone (IM sublayer)-formed pressure-sensitive adhesive sheets each defined by the IM sublayer, respectively, to two ITO layers 23 defining opposite surfaces of a transparent electroconductive film 25.

A laminate 26 depicted in FIG. 6(b) is a double-sided ITO film laminate sensor comprising two refractive index adjustment zone-formed pressure-sensitive adhesive layers (IM sublayer-formed pressure-sensitive adhesive layers 22), according to one embodiment of the present invention, wherein the laminate 26 is formed by attaching one-side surfaces of the refractive index adjustment zone (IM sublayer)-formed pressure-sensitive adhesive layers each defined by the IM sublayer, respectively, to two patterned ITO layers 23 defining opposite surfaces of a transparent electroconductive film 27. The other-side surfaces of the refractive index adjustment zone (IM sublayer)-formed pressure-sensitive adhesive layers (IM sublayer-formed pressure-sensitive adhesive layers 22) on a side opposite to the surfaces attached to the patterned ITO layers 23 are attached, respectively, to a cover glass 28 and a protective film 29 each of which is a cover element.

A laminate 30 depicted in FIG. 6(c) is a double-sided ITO film laminate sensor comprising two refractive index adjustment zone-formed pressure-sensitive adhesive layers (IM sublayer-formed pressure-sensitive adhesive layers 22), according to one embodiment of the present invention, wherein the laminate 30 is applied to an image display device 32 such as LCD or OLED. When a person who wears polarized sunglasses views an image display device (LCD or OLED), a polarization axis of the sunglasses is likely to become orthogonal to a polarization axis of a polarizing plate on the image display device (LCD or OLED), depending on angle, so that the person can completely fail to view a display (the person's vision is completely darkened). As a measure against this problem, the film substrate may be composed of a λ/4 plate, and disposed such that a slow axis thereof is angled at 45 degrees with respect to the polarization axis of the polarizing plate. Thus, linearly-polarized light exiting from the image display device can be converted into circularly-polarized light, so that, even when viewing through the polarized sunglasses, it becomes possible to prevent the person's vision from being completely darkened.

FIG. 6(d) depicts a modification of the sensor configuration depicted in FIG. 6(c), specifically, a configuration of a double-sided ITO film laminate sensor comprising a film substrate which has one surface formed with a sensor pattern and the other surface formed with an electromagnetic shielding layer.

[Double-Sided Transparent Conductive Film (1)]

Figure 7A:
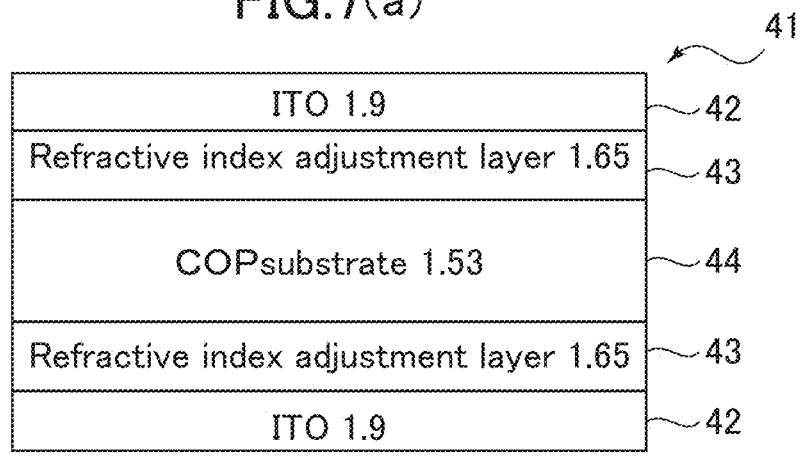
FIG. 7(a) depicts a configuration of a double-sided transparent electroconductive film produced in Inventive Examples.
Figure 7B:
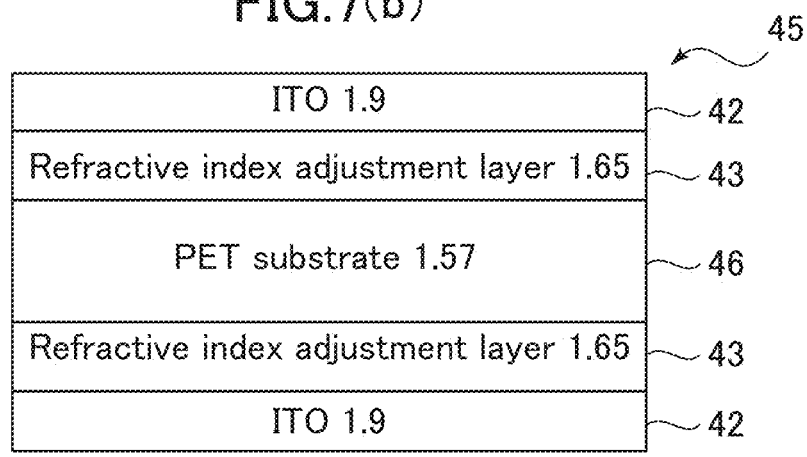
FIG. 7(b) depicts a configuration of another double-sided transparent electroconductive film produced in Inventive Examples.

As an optical element having opposite surfaces to each of which a refractive index adjustment zone (sublayer)-formed pressure-sensitive adhesive layer is laminated, a laminate 41 depicted in FIG. 7(a) and a laminate 45 depicted in FIG. 7(b) were prepared. The laminate 41 depicted in FIG. 7(a) comprises: a COP substrate 44 having a refractive index of 1.53; two refractive index adjustment layers 43 each having a refractive index of 1.65 and formed, respectively, on opposite surfaces of the COP substrate 44; and two patternable ITO layers 42 formed, respectively, on surfaces of the refractive index adjustment layers 43. Each of the ITO layers 42 has a refractive index of 1.9. This laminate 41 will be referred to as "double-sided transparent electroconductive film (1)". A value described in each layer in FIG. 7(a) denotes a refractive index. Similarly, a value described in each layer in the following figures (FIGS. 7(b) to 10(d)) denotes a refractive index, unless a unit is indicated.

[Double-Sided Transparent Conductive Film (2)]

The laminate 45 depicted in FIG. 7(b) comprises: a PET substrate 46 having a refractive index of 1.57; two refractive index adjustment layers 43 each having a refractive index of 1.65 and formed, respectively, on opposite surfaces of the PET substrate 46; and two patternable ITO layers 42 formed, respectively, on surfaces of the refractive index adjustment layers 43. In this case, each of the ITO layers 42 also has a refractive index of 1.9. This laminate 45 will be referred to as "double-sided transparent electroconductive film (2)".

Figure 8A:
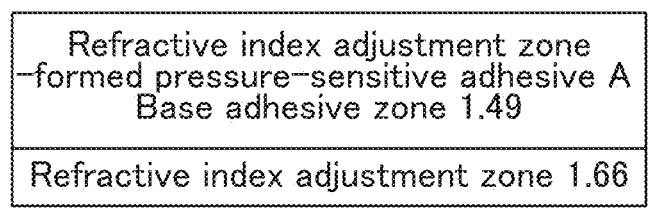
FIG. 8(a) depicts a configuration of a refractive index adjustment zone-formed pressure-sensitive adhesive sheet (A1) for use in Inventive Examples and Comparative Examples.
Figure 8B:
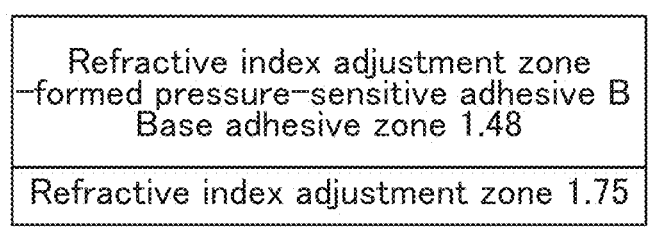
FIG. 8(b) depicts a configuration of another refractive index adjustment zone-formed pressure-sensitive adhesive sheet (B1) for use in Inventive Examples and Comparative Examples.
Figure 8C:
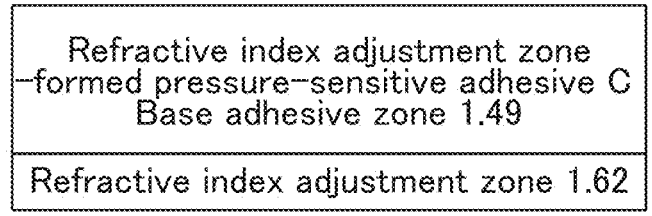
FIG. 8(c) depicts a configuration of yet another refractive index adjustment zone-formed pressure-sensitive adhesive sheet (C1) for use in Inventive Examples and Comparative Examples.

Configuration of the refractive index adjustment zone-formed pressure-sensitive adhesive sheets (A1), (B1) and (C1) obtained by the method described in the aforementioned [Production of refractive index adjustment zone-formed pressure-sensitive adhesives] are depicted, respectively, in FIGS. 8(a), 8(b) and 8(c). One of the refractive index adjustment zone-formed pressure-sensitive adhesive sheets (A1), (B1) and (C1) was laminated to each of opposite surfaces of one of the double-sided transparent electroconductive film (1) and (2), to form Inventive Examples 1 to 4. By using the double-sided transparent electroconductive film as mentioned above, it becomes possible to reduce the number of steps of a lamination process during production of the laminate. In addition, by forming an electroconductive pattern on opposite sides of or on one side of the film substrate, it becomes possible to eliminate a bothersome operation such as (X, Y) position adjustment of the pattern.

Inventive Example 1

Figure 9A:
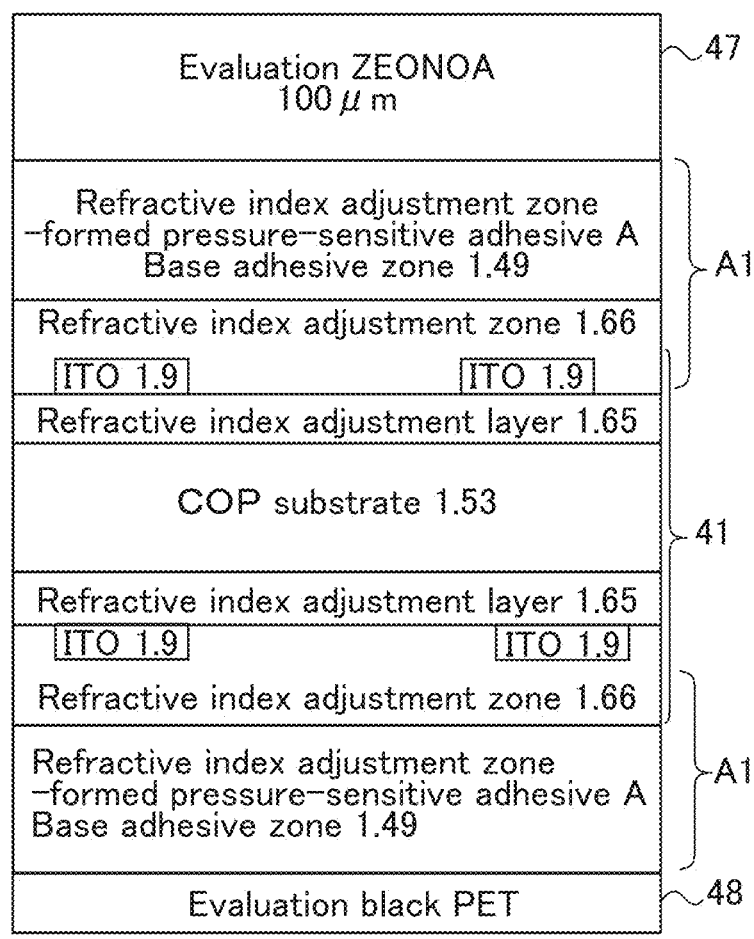
FIG. 9(a) depicts a configuration of an optical element laminate in Inventive Example 1.

Based on the method described in the aforementioned <Production of optical element laminate functioning as touch panel sensor>, an optical element laminate depicted in FIG. 9(a) was produced. The optical element laminate depicted in FIG. 9(a) was formed by: attaching one-side surfaces of two refractive index adjustment zone (sublayer)-formed pressure-sensitive adhesive sheets (A1) each defined by the refractive index adjustment zone, respectively, to surfaces of two patterned ITO layers on opposite sides of a double-sided transparent electroconductive film (1) (laminate 41); laminating an evaluation ZEONOA 47 to the other-side surface of an upper one of the refractive index adjustment zone (sublayer)-formed pressure-sensitive adhesive sheets (A1); and laminating an evaluation black PET film 48 for reflectance measurement, to the other-side surface of a lower one of the refractive index adjustment zone (sublayer)-formed pressure-sensitive adhesive sheets (A1).

Inventive Example 2

Figure 9B:
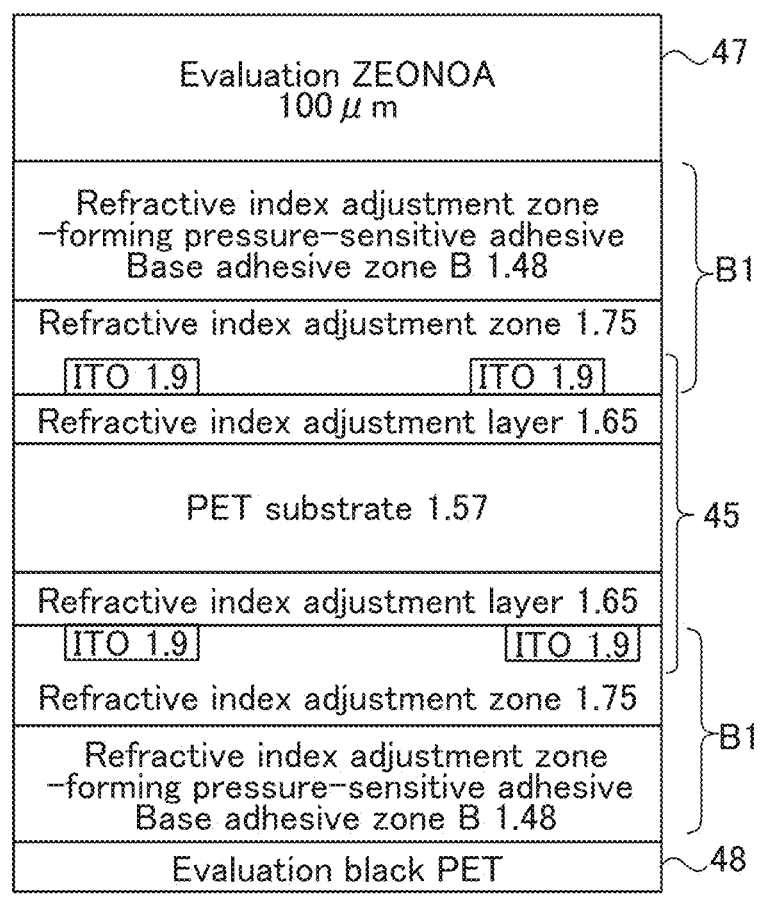
FIG. 9(b) depicts a configuration of an optical element laminate in Inventive Example 2.

An optical element laminate depicted in FIG. 9(b) was produced in the same manner as that in Inventive Example 1. The optical element laminate depicted in FIG. 9(b) was formed by: attaching one-side surfaces of two refractive index adjustment zone (sublayer)-formed pressure-sensitive adhesive sheets (B1) each defined by the refractive index adjustment zone, respectively, to surfaces of two patterned ITO layers on opposite sides of a double-sided transparent electroconductive film (2) (laminate 45); laminating an evaluation ZEONOA 47 to the other-side surface of an upper one of the refractive index adjustment zone (sublayer)-formed pressure-sensitive adhesive sheets (B1); and laminating an evaluation black PET film 48 for reflectance measurement, to the other-side surface of a lower one of the refractive index adjustment zone (sublayer)-formed pressure-sensitive adhesive sheets (B1).

Inventive Example 3

Figure 9C:
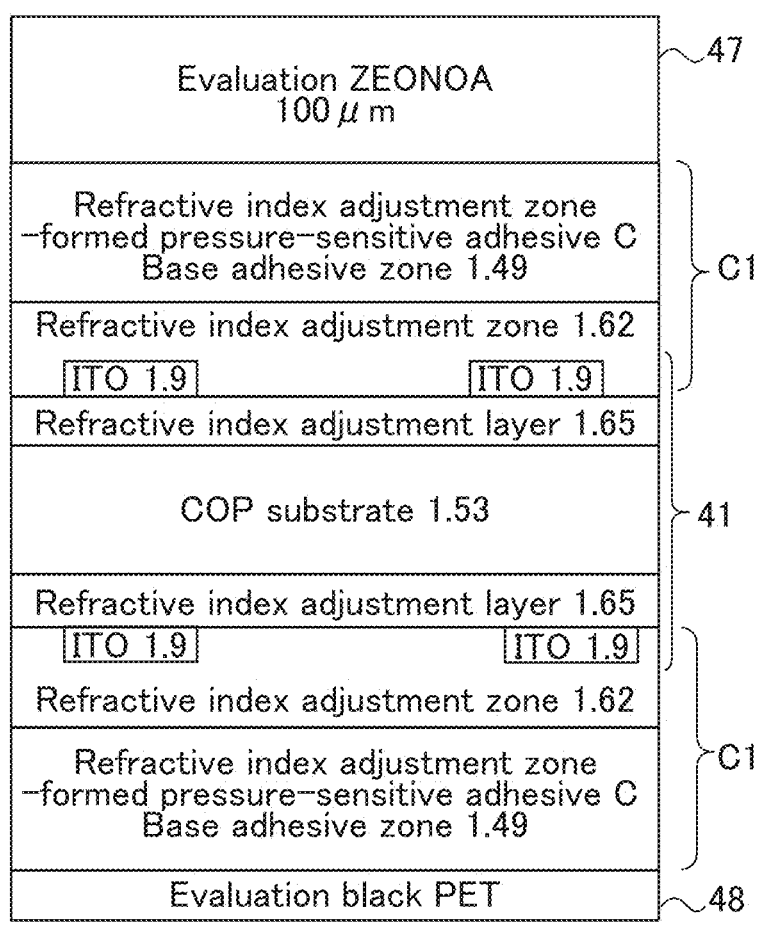
FIG. 9(c) depicts a configuration of an optical element laminate in Inventive Example 3.

An optical element laminate depicted in FIG. 9(c) was produced in the same manner as that in Inventive Examples 1 and 2. The optical element laminate depicted in FIG. 9(c) was formed by: attaching one-side surfaces of two refractive index adjustment zone (sublayer)-formed pressure-sensitive adhesive sheets (C1) each defined by the refractive index adjustment zone, respectively, to surfaces of two patterned ITO layers on opposite sides of a double-sided transparent electroconductive film (1) (laminate 41); laminating an evaluation ZEONOA 47 to the other-side surface of an upper one of the refractive index adjustment zone (sublayer)-formed pressure-sensitive adhesive sheets (C1); and laminating an evaluation black PET film 48 for reflectance measurement, to the other-side surface of a lower one of the refractive index adjustment zone (sublayer)-formed pressure-sensitive adhesive sheets (C1).

Inventive Example 4

Figure 9D:
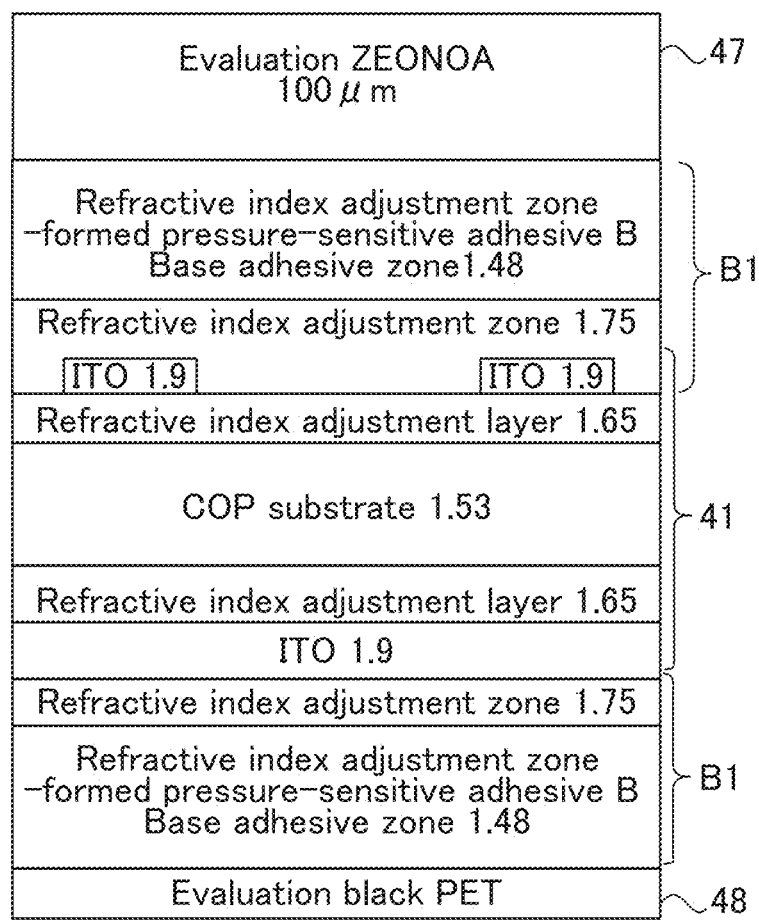
FIG. 9(d) depicts a configuration of an optical element laminate in Inventive Example 4.

An optical element laminate depicted in FIG. 9(d) was produced in the same manner as that in Inventive Examples 1 to 3. The optical element laminate depicted in FIG. 9(d) was formed by: attaching one-side surfaces of two refractive index adjustment zone (sublayer)-formed pressure-sensitive adhesive sheets (B1) each defined by the refractive index adjustment zone, respectively, to surfaces of a patterned ITO layer and a non-patterned ITO layer on opposite sides of a double-sided transparent electroconductive film (1) (laminate 41); laminating an evaluation ZEONOA 47 to the other-side surface of an upper one of the refractive index adjustment zone (sublayer)-formed pressure-sensitive adhesive sheets (B1); and laminating an evaluation black PET film 48 for reflectance measurement, to the other-side surface of a lower one of the refractive index adjustment zone (sublayer)-formed pressure-sensitive adhesive sheets (B1).

Comparative Example 1

Figure 10A:
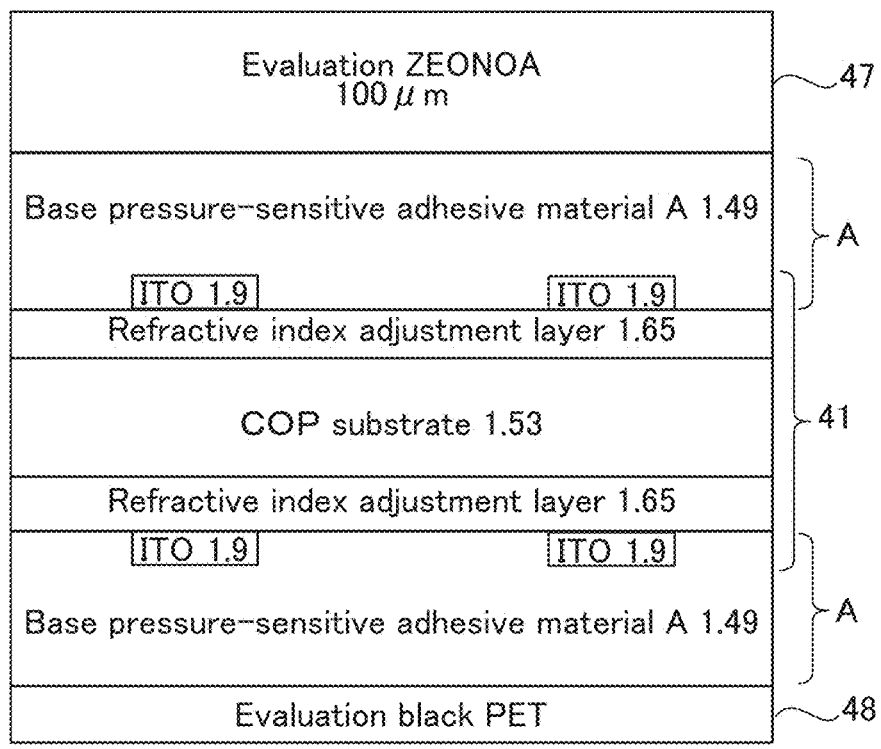
FIG. 10(a) depicts a configuration of an optical element laminate in Comparative Example 1.

Based on the method described in the aforementioned <Production of optical element laminate functioning as touch panel sensor>, an optical element laminate depicted in FIG. 10(a) was produced. The optical element laminate depicted in FIG. 10(a) was formed by: attaching one-side surfaces of two sheet-shaped base pressure-sensitive adhesive material layers A, respectively, to surfaces of two patterned ITO layers on opposite sides of a double-sided transparent electroconductive film (1) (laminate 41); laminating an evaluation ZEONOA 47 to the other-side surface of an upper one of the sheet-shaped base pressure-sensitive adhesive material layers A; and laminating an evaluation black PET film 48 for reflectance measurement, to the other-side surface of a lower one of the sheet-shaped base pressure-sensitive adhesive material layers A.

Comparative Example 2

Figure 10B:
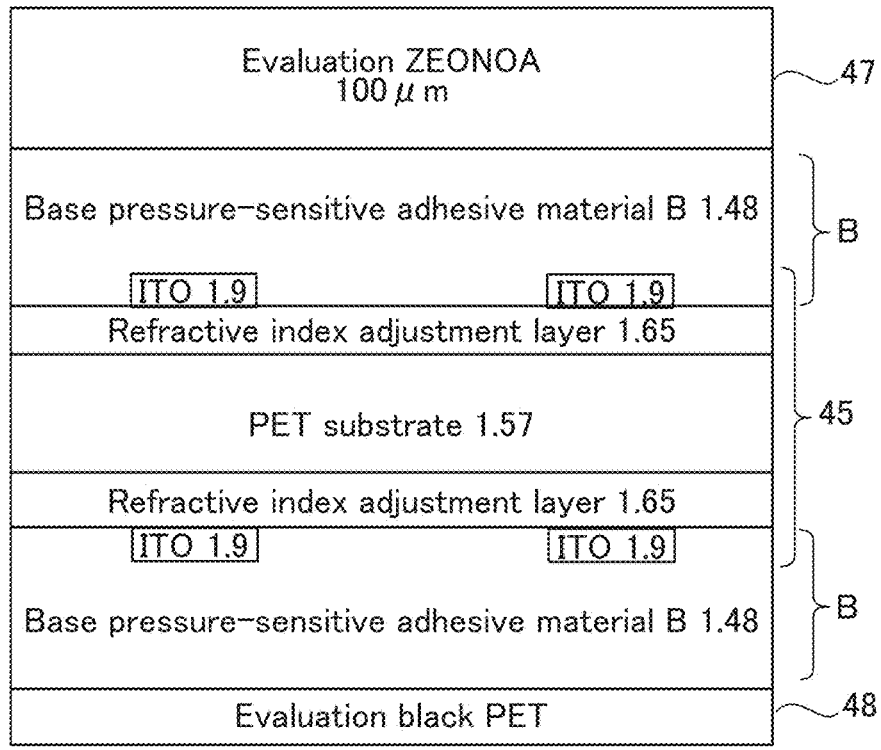
FIG. 10(b) depicts a configuration of an optical element laminate in Comparative Example 2.

An optical element laminate depicted in FIG. 10(b) was produced in the same manner as that in Comparative Example 1. The optical element laminate depicted in FIG. 10(b) was formed by: attaching one-side surfaces of two sheet-shaped base pressure-sensitive adhesive material layers B, respectively, to surfaces of two patterned ITO layers on opposite sides of a double-sided transparent electroconductive film (2) (laminate 45); laminating an evaluation ZEONOA 47 to the other-side surface of an upper one of the sheet-shaped base pressure-sensitive adhesive material layers B; and laminating an evaluation black PET film 48 for reflectance measurement, to the other-side surface of a lower one of the sheet-shaped base pressure-sensitive adhesive material layers B.

Comparative Example 3

Figure 10C:
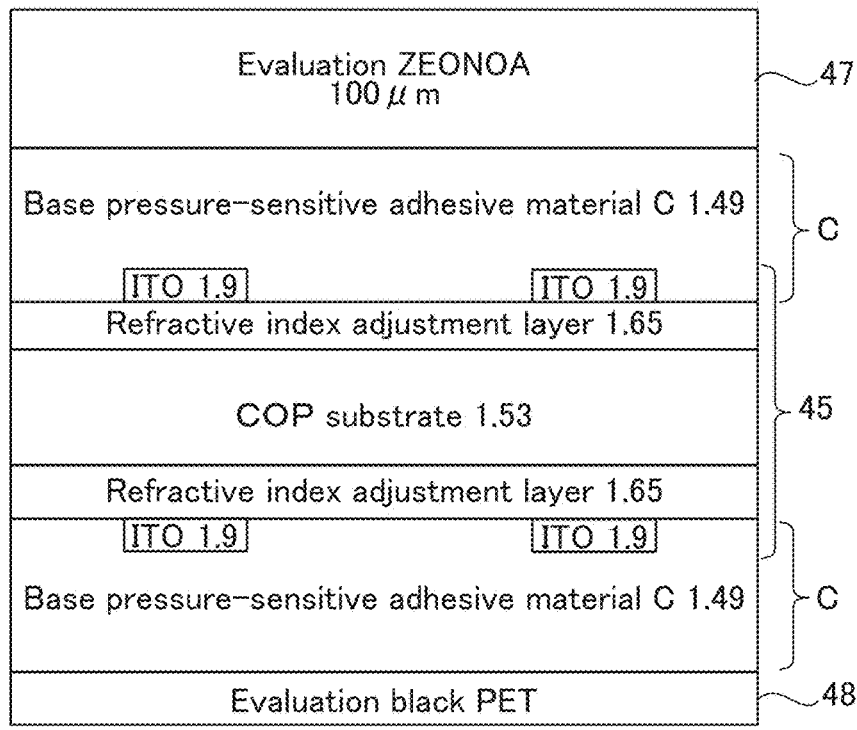
FIG. 10(c) depicts a configuration of an optical element laminate in Comparative Example 3.

An optical element laminate depicted in FIG. 10(c) was produced in the same manner as that in Comparative Examples 1 and 2. The optical element laminate depicted in FIG. 10(c) was formed by: attaching one-side surfaces of two sheet-shaped base pressure-sensitive adhesive material layers C, respectively, to surfaces of two patterned ITO layers on opposite sides of a double-sided transparent electroconductive film (1) (laminate 41); laminating an evaluation ZEONOA 47 to the other-side surface of an upper one of the sheet-shaped base pressure-sensitive adhesive material layers C; and laminating an evaluation black PET film 48 for reflectance measurement, to the other-side surface of a lower one of the sheet-shaped base pressure-sensitive adhesive material layers C.

Comparative Example 4

Figure 10D:
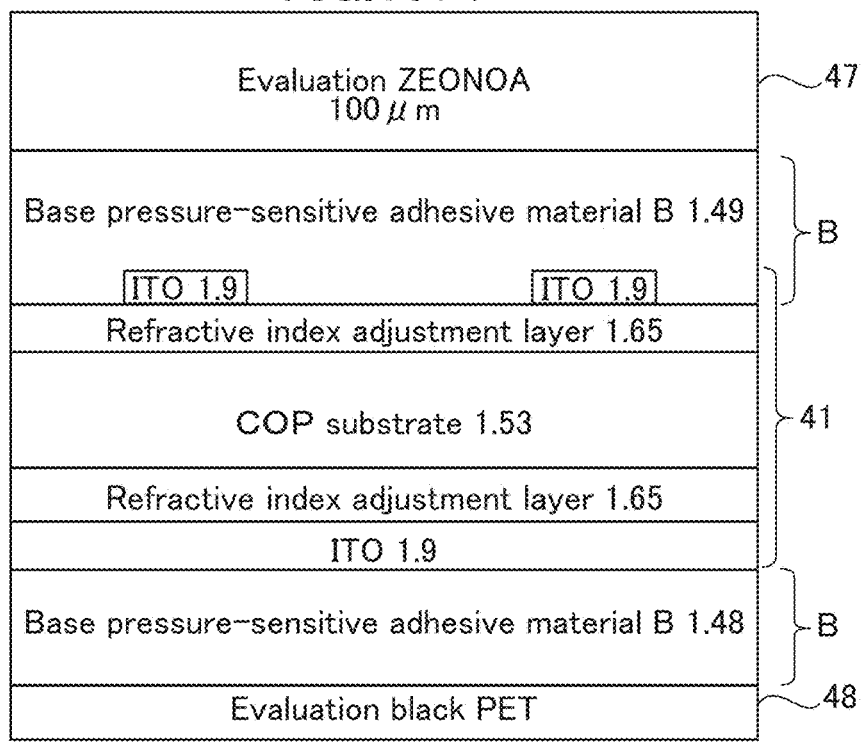
FIG. 10(d) depicts a configuration of an optical element laminate in Comparative Example 4.

An optical element laminate depicted in FIG. 10(d) was produced in the same manner as that in Comparative Examples 1 to 3. The optical element laminate depicted in FIG. 10(d) was formed by: attaching one-side surfaces of two sheet-shaped base pressure-sensitive adhesive material layers B, respectively, to surfaces of a patterned ITO layer and a non-patterned ITO layer on opposite sides of a double-sided transparent electroconductive film (1) (laminate 41); laminating an evaluation ZEONOA 47 to the other-side surface of an upper one of the sheet-shaped base pressure-sensitive adhesive material layers B; and laminating an evaluation black PET film 48 for reflectance measurement, to the other-side surface of a lower one of the sheet-shaped base pressure-sensitive adhesive material layers B.

With respect to each of Inventive Examples 1 to 4 and Comparative Examples 1 to 4 obtained in the above manner, a reflectance and a reflection suppression rate in the ITO region and a reflectance and a reflection suppression rate in the substrate region are presented in the following table.

TABLE 2

|  | Reflectance in ITO Region (Reflection Suppresion Rate) | Reflectance in Substrate Region (Reflection Suppression Rate) |
| --- | --- | --- |
| Inventive Example 1 | 5.4% (−1.2%) | 5.4% (−1.0%) |
| Inventive Example 2 | 5.6% (−1.2%) | 5.3% (−0.9%) |
| Inventive Example 3 | 5.6% (−1.0%) | 5.5% (−0.9%) |
| Inventive Example 4 | 5.4% (−1.2) | 5.4% (−1.1) |
| Comparative Example 1 | 6.6% (−) | 6.4% (−) |
| Comparative Example 2 | 6.8% (−) | 6.6% (−) |
| Comparative Example 3 | 6.6% (−) | 6.4% (−) |
| Comparative Example 4 | 6.6% (−) | 6.5% (−) |

As is evident from the result in the above table, the reflection suppression rates in Inventive Examples 1 to 4 obtained by applying one of the refractive index adjustment zone (sublayer)-formed pressure-sensitive adhesives (A1), (B1) and (C1) to the double-sided transparent electroconductive film (1) or (2) are in the range of −1.2% to −0.9%, i.e., an improvement effect of suppressing reflection was obtained by each of the refractive index adjustment zone-formed pressure-sensitive adhesive layers. On the other hand, in Comparative Examples 1 to 4 each devoid of the refractive index adjustment zone, reflection was not particularly suppressed, i.e., no improvement effect was observed. This shows that the double-sided transparent electroconductive film laminate according to the present invention, formed by laminating the refractive index adjustment zone-formed pressure-sensitive adhesive sheets to the double-sided transparent electroconductive film can effectively suppress reflection.

INDUSTRIAL APPLICABILITY

As mentioned above, the present invention employs a pressure-sensitive adhesive layer for bonding a first optical element to a second optical element, wherein the refractive index adjustment zone having a refractive index greater than a refractive index of the base pressure-sensitive adhesive material is formed over a given range from a surface of the pressure-sensitive adhesive layer on the side of the second optical element, in the thickness direction of the pressure-sensitive adhesive layer. Thus, it becomes possible to suppress the situation where internal reflections of external light are returned through the first optical element. The present invention can be applied to an optical display device, such as a liquid crystal display device and an organic EL display device. In particular, the present invention can be advantageously applied to a touch panel type display device having a touch sensor.

LIST OF REFERENCE SIGNS

S: pressure-sensitive adhesive sheet
S1, S2: support (backing)
1: optical element laminate
2: first optical element
3, 13: transparent pressure-sensitive adhesive layer
3a, 13a: base adhesive zone
3b, 13b: refractive index adjustment zone
4: second optical element
7: transparent electroconductive layer
17: high refractive index material particle
19: dispersion liquid
20: base pressure-sensitive adhesive material layer
21, 26, 30, 33, 41, 45: laminate
22: IM layer-formed pressure-sensitive adhesive layer
23: ITO layer
24: film substrate
25, 27, 31, 34: transparent electroconductive film
28: cover glass
39: protective film
43: refractive index adjustment layer
44: COP substrate
46: PET substrate
47: evaluation ZEONOA
48: evaluation PET

The invention claimed is:

1. A double-sided transparent electroconductive film laminate comprising:
   a transparent film substrate;
   a first transparent electroconductive layer on one of opposite surfaces of the transparent film substrate;
   a second transparent electroconductive layer on the other surface of the transparent film substrate;
   a transparent, first pressure-sensitive adhesive layer on a surface of the first transparent electroconductive layer on a side opposite to the transparent film substrate; and
   a transparent, second pressure-sensitive adhesive layer on a surface of the second transparent electroconductive layer on a side opposite to the transparent film substrate,
   wherein each of the first and second pressure-sensitive adhesive layers comprises:
      a base adhesive zone made essentially of a transparent base pressure-sensitive adhesive material and formed over a given range from one principal surface of the pressure-sensitive adhesive layer in a thickness direction of the pressure-sensitive adhesive layer; and
      a transparent, adherent, refractive index adjustment zone formed over a given range from the other principal surface of the pressure-sensitive adhesive layer in the thickness direction, the refractive index adjustment zone being in contact with a corresponding one of the first and second transparent electroconductive layers, and having a refractive index greater than a refractive index of the base pressure-sensitive adhesive material.

2. The double-sided transparent electroconductive film laminate as recited in claim 1, wherein each of the first and second transparent electroconductive layers is patterned.

3. The double-sided transparent electroconductive film laminate as recited in claim 1, wherein the first transparent electroconductive layer is patterned, and the second transparent electroconductive layer is not patterned.

4. The double-sided transparent electroconductive film laminate as recited in claim 2, which further comprises:
   a cover element on a surface of the first pressure-sensitive adhesive layer on a side opposite to the first transparent electroconductive layer; and
   an image display device or a protective film on a surface of the second pressure-sensitive adhesive layer on a side opposite to the second transparent electroconductive layer.

5. The double-sided transparent electroconductive film laminate as recited in claim 1, wherein the transparent film substrate has a thickness of 2 μm to 200 μ.m.

6. The double-sided transparent electroconductive film laminate as recited in claim 1, wherein the refractive index adjustment zone has a thickness of 20 nm to 600 nm.

7. The double-sided transparent electroconductive film laminate as recited in claim 1, wherein the refractive index adjustment zone is formed by dispersing, in a pressure-sensitive adhesive material identical to the base pressure-sensitive adhesive material, particles of a high refractive index material having a refractive index greater than that of the pressure-sensitive adhesive material, to thereby increase an average refractive index of the refractive index adjustment zone.

8. The double-sided transparent electroconductive film laminate as recited in claim 7, wherein the refractive index of the high refractive index material particles is in the range of 1.60 to 2.74.

9. The double-sided transparent electroconductive film laminate as recited in claim 7, wherein the high refractive index material particles have an average primary particle size of 3 nm to 100 nm as measured by TEM observation.

10. The double-sided transparent electroconductive film laminate as recited in claim 7, wherein a difference between the refractive index of the high refractive index material particles and the refractive index of the base pressure-sensitive adhesive material is in the range of 0.15 to 1.34.

11. The double-sided transparent electroconductive film laminate as recited in claim 7, wherein the high refractive index material is one or more compounds selected from the group consisting of $TiO_2$, $ZrO_2$, $CeO_2$, $Al_2O_3$, $BaTiO_3$, $Nb_2O_5$ and $SnO_2$.

12. The double-sided transparent electroconductive film laminate as recited in claim 1, wherein the refractive index adjustment zone is formed by adding, to a pressure-sensitive adhesive material identical to the base pressure-sensitive adhesive material, an organic material having a refractive index greater than that of the pressure-sensitive adhesive material, in the form of particle, polymer or oligomer, to thereby increase an average refractive index of the refractive index adjustment zone.

13. The double-sided transparent electroconductive film laminate as recited in claim 12, wherein the refractive index of the base pressure-sensitive adhesive material is in the range of 1.40 to 1.55, and the refractive index of the organic material is in the range of 1.59 to 2.04.

14. The double-sided transparent electroconductive film laminate as recited in claim 1, wherein each of the first and second pressure-sensitive adhesive layers has a total light transmittance of 80% or more.

15. The double-sided transparent electroconductive film laminate as recited in claim 7, wherein the high refractive index material particles partially exist in the form of an aggregate arising from aggregation of two or more thereof.

16. The double-sided transparent electroconductive film laminate as recited in claim 1, wherein the refractive index adjustment zone exists with irregular depths in the thickness direction of the pressure-sensitive adhesive layer.

17. The double-sided transparent electroconductive film laminate as recited in claim 1, wherein the transparent film substrate comprises: a first refractive index adjustment layer with respect to the first transparent electroconductive layer; and a second refractive index adjustment layer with respect to the second transparent electroconductive layer.

18. The double-sided transparent electroconductive film laminate as recited in claim 1, wherein a refractive index $n1$ of each of the first and second transparent electroconductive layers, the refractive index $n2$ of the refractive index adjustment zone and the refractive index $n3$ of the transparent base pressure-sensitive adhesive material satisfy the following relationship: $n1>n2>n3$.

* * * * *